United States Patent
Osaka et al.

(10) Patent No.: US 7,558,336 B2
(45) Date of Patent: Jul. 7, 2009

(54) SEMICONDUCTOR DEVICE, MEMORY DEVICE AND MEMORY MODULE HAVING DIGITAL INTERFACE

(75) Inventors: Hideki Osaka, Oiso (JP); Yoji Nishio, Sagamihara (JP); Seiji Funaba, Sagamihara (JP); Kazuyoshi Shoji, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 700 days.

(21) Appl. No.: 10/982,946

(22) Filed: Nov. 8, 2004

(65) Prior Publication Data

US 2006/0018407 A1 Jan. 26, 2006

(30) Foreign Application Priority Data

Jul. 26, 2004 (JP) ............... 2004-217509

(51) Int. Cl.
*H03K 9/00* (2006.01)
*H04B 3/46* (2006.01)
*G06K 5/04* (2006.01)
*H03M 13/00* (2006.01)
*G06F 13/42* (2006.01)

(52) U.S. Cl. ............... 375/316; 375/226; 714/700; 714/775; 713/400

(58) Field of Classification Search .......... 375/316, 375/371, 226; 714/43, 700, 500, 775; 365/194, 365/233.11; 713/400, 500; 395/183.19
See application file for complete search history.

(56) References Cited

U.S. PATENT DOCUMENTS 4,907,230 A * 3/1990 Heller et al. ............... 714/724

(Continued)

FOREIGN PATENT DOCUMENTS

DE 540115 A2 * 5/1993

(Continued)

OTHER PUBLICATIONS

"Statistical clock skew modeling with data delay variations"; Harris, D.; Naffziger, S.; Very Large Scale Integration (VLSI) Systems, IEEE Transactions on ; vol. 9, Issue 6, Dec. 2001 pp. 888-898.*

(Continued)

*Primary Examiner*—Mohammad H Ghayour
*Assistant Examiner*—Sarah Hassan
(74) *Attorney, Agent, or Firm*—Brundidge & Stanger, P.C.

(57) ABSTRACT

An object of the present invention is to reduce jitter dependent on data patterns by an interface receiver. Another object of the present invention is to provide an LSI capable of automatically adjusting a delay time for jitter reduction so as to be able to control its setting for each device. Since the jitter dependent on the data patterns can be expected according to how the previous state is being placed, the state of data received by the receiver is held, and the timing provided to fetch input data is adjusted according to the held state and the input data. As a control mechanism lying in the receiver, for determining a delay time dependent on the form of mounting, a driver transmits and receives pulse data set at one-cycle intervals and pulse data set at two-cycle intervals as test patterns. The receiver has an automatic control mechanism for determining a delay time optimal to a system from the difference between a rising time of each of pulses different in pulse width and its falling time.

4 Claims, 18 Drawing Sheets

U.S. PATENT DOCUMENTS

| | | | | |
|---|---|---|---|---|
| 5,528,754 | A * | 6/1996 | Okamoto | 714/43 |
| 5,621,774 | A * | 4/1997 | Ishibashi et al. | 375/371 |
| 5,870,594 | A * | 2/1999 | Doi et al. | 713/500 |
| 5,896,347 | A * | 4/1999 | Tomita et al. | 365/233.11 |
| 5,953,521 | A | 9/1999 | Dabral et al. | |
| 6,157,688 | A * | 12/2000 | Tamura et al. | 375/348 |
| 6,166,971 | A * | 12/2000 | Tamura et al. | 365/198 |
| 6,178,123 | B1 * | 1/2001 | Kato et al. | 365/194 |
| 6,247,138 | B1 * | 6/2001 | Tamura et al. | 713/600 |
| 6,317,369 | B1 * | 11/2001 | Kubo et al. | 365/193 |
| 6,356,976 | B1 * | 3/2002 | Ueki et al. | 711/111 |
| 6,577,687 | B2 | 6/2003 | Hall et al. | |
| 6,661,717 | B1 * | 12/2003 | Gomm et al. | 365/194 |
| 2004/0068682 | A1 * | 4/2004 | Takei et al. | 714/700 |
| 2005/0140417 | A1 * | 6/2005 | Patel et al. | 327/277 |

FOREIGN PATENT DOCUMENTS

| | | | |
|---|---|---|---|
| EP | 1355427 | A1 * | 10/2003 |

OTHER PUBLICATIONS

"Techniques for characterizing DRAMs with a 500 MHz interface"; Gasbarro, J.A.; Horowitz, M.A.; Test Conference, 1994. Proceedings., International; Oct. 2-6, 1994 pp. 516-525.*

Excess phase jitter cancellation method for SC relaxation oscillators Silva-Martinez, J.; Sanchez-Sinencio, E.; Circuits and Systems, IEEE Transactions on vol. 34, Issue 6, Jun. 1987 pp. 695-700.*

* cited by examiner

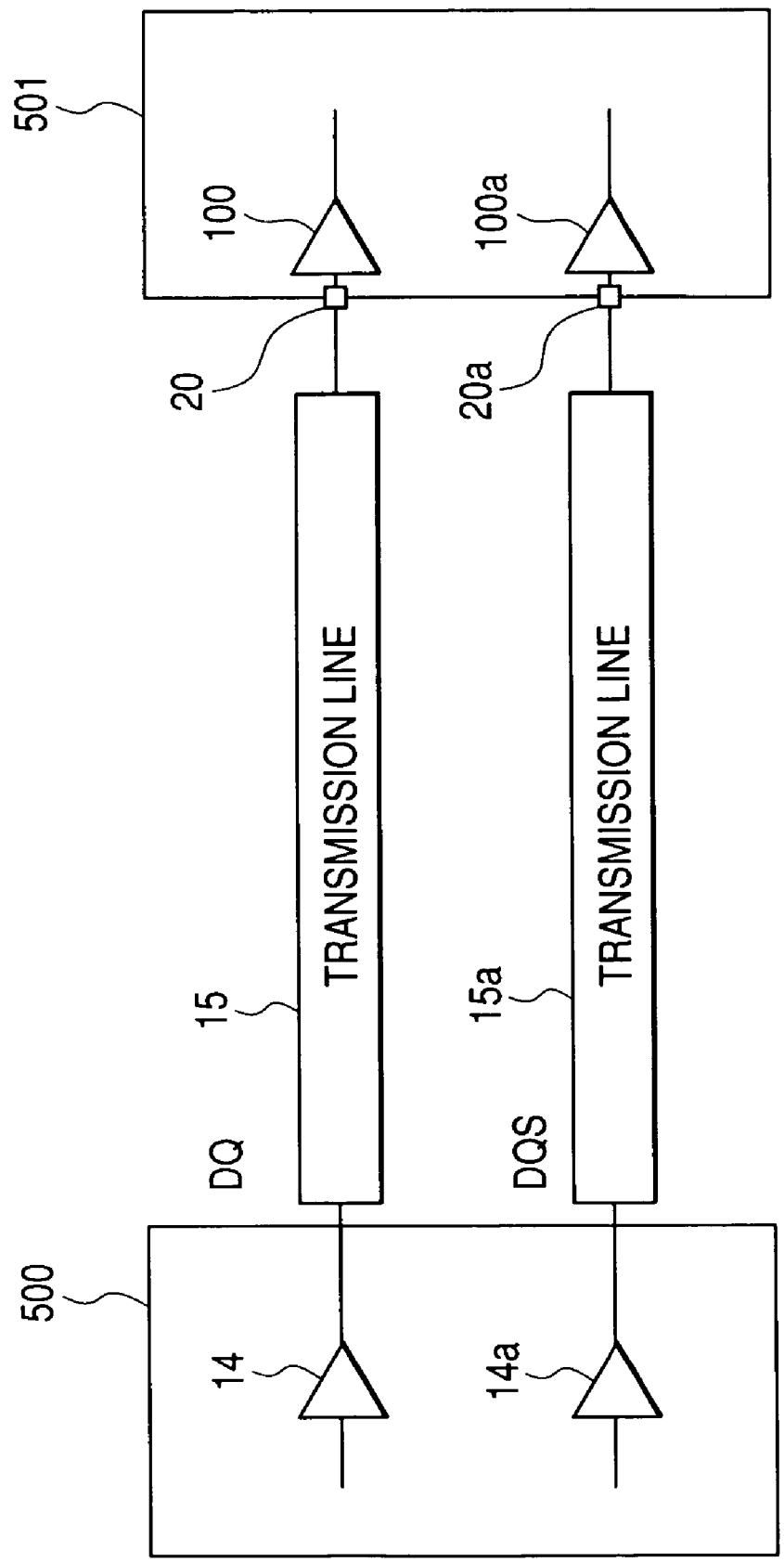

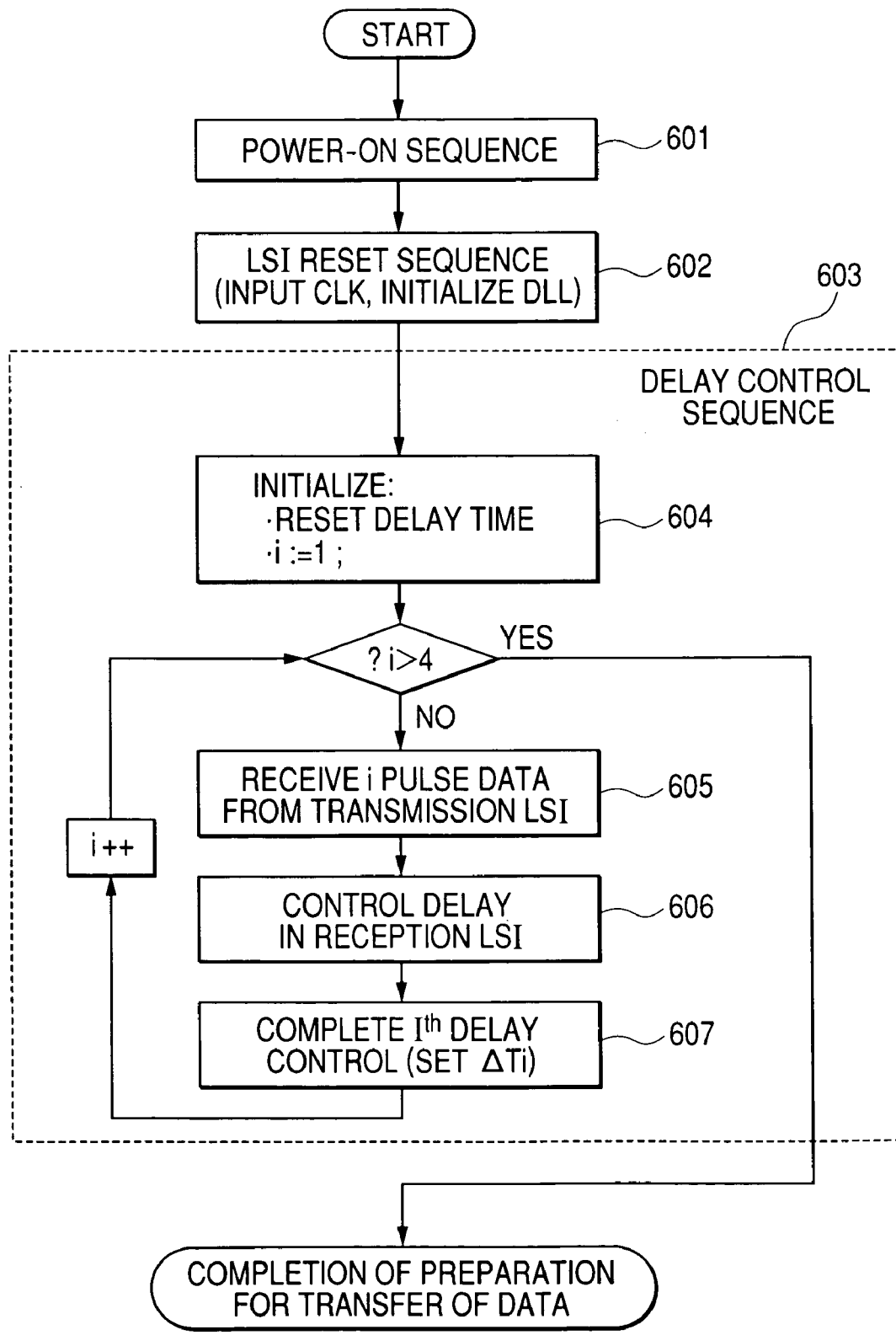
FIG. 10-a

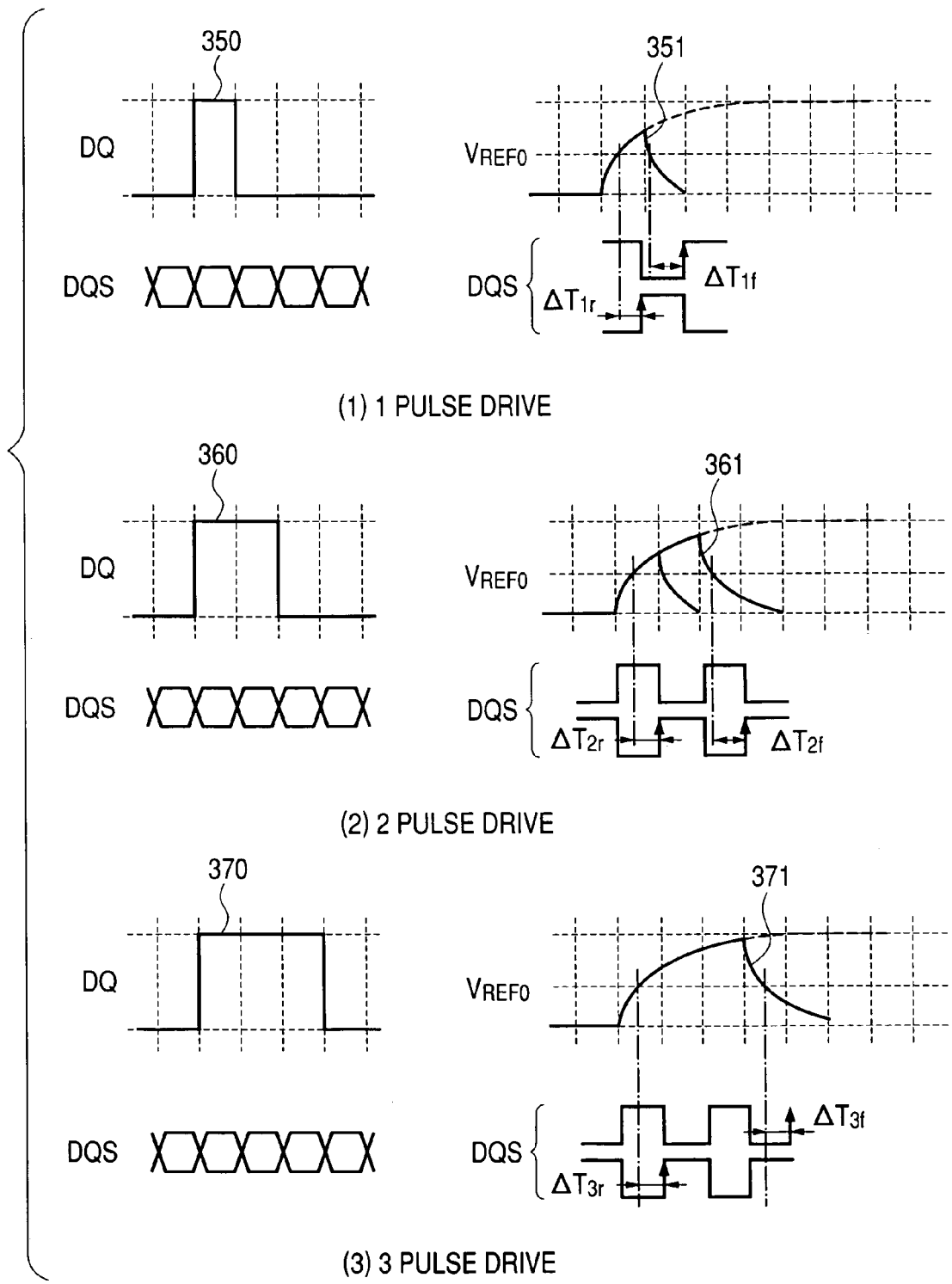
FIG. 10-b

CONVENTIONAL 4-CYCLE TYPE ($\tau = t_{cycle}$) DATA SIGNAL WAVEFORM AND COMPARATOR OUTPUT SIGNAL STATE TRANSITION DIAGRAM WITH RESPECT TO 2-CYCLE TYPE ($\tau=0.5t_{cycle}$) DATA SIGNAL

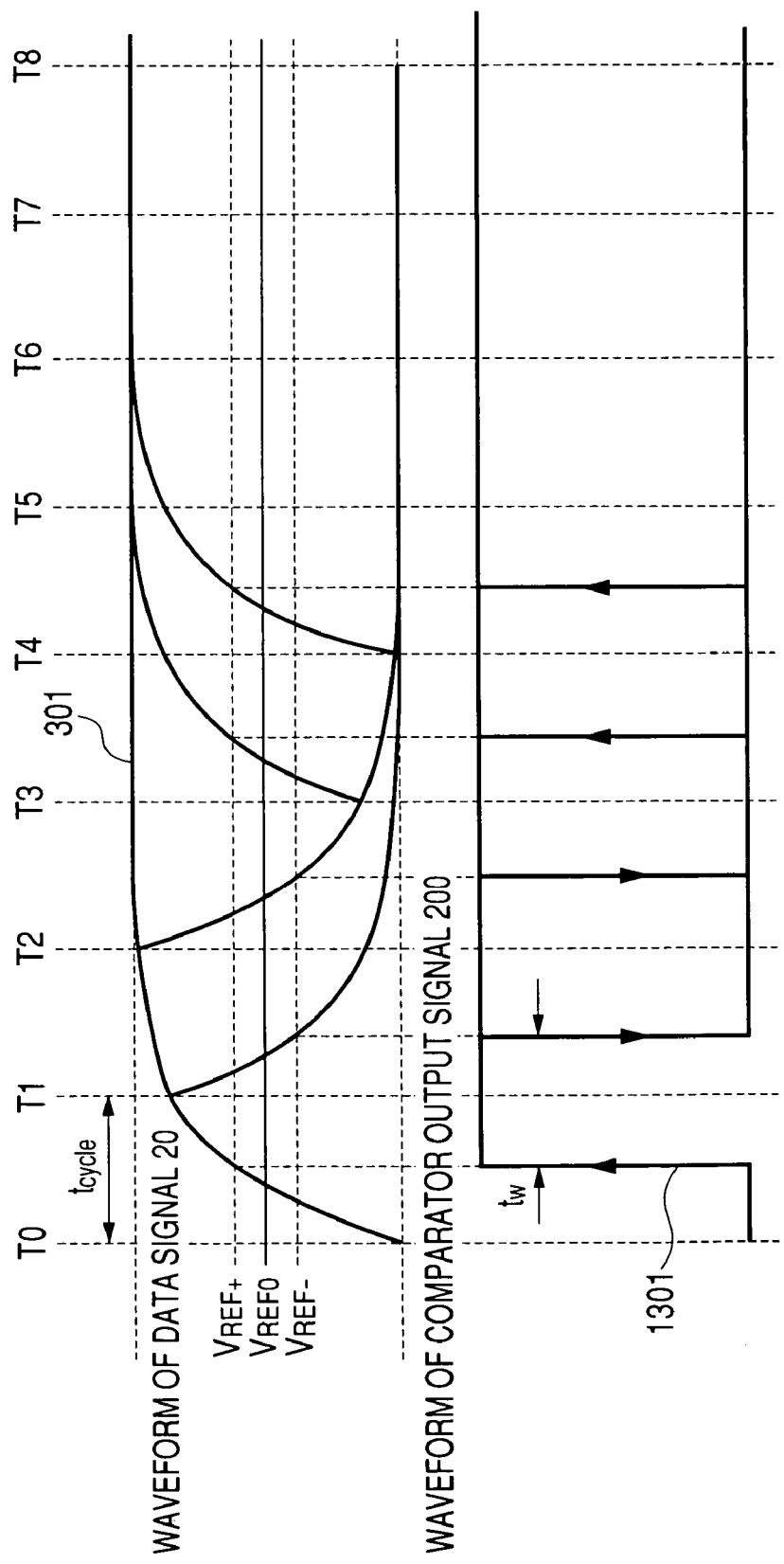

SEMICONDUCTOR DEVICE, MEMORY DEVICE AND MEMORY MODULE HAVING DIGITAL INTERFACE

CLAIM OF PRIORITY

The present application claims priority from Japanese application serial no. 2004-217509, filed on Jul. 26, 2004, the content of which is hereby incorporated by reference into this application.

BACKGROUND OF THE INVENTION

1. Field of the Invention

The present invention relates to a bus connection technique for connecting among functional circuits such as a processor, a memory, etc., which is used in an information processing apparatus such as a personal computer or the like, and its constituent elements, and particularly to a semiconductor device which realizes low jitter in a digital signal interface.

2. Description of the Related Art

When digital data is transferred among functional circuits such as a processor, a memory, etc. in an apparatus, a physical portion related to the data transfer is divided into two. That is, they are transmission lines which connect between a semiconductor device (hereinafter called "LSI") for realizing a functional circuit and an LSI. They are collectively called "interface". Although the speeding up of the interface is essential to an improvement in the performance of the apparatus, the speeding up thereof is becoming difficult due to physical restrictions on the transmission lines.

When the transfer of data is performed between two LSIs 14 and 16 as shown in FIG. 3, for example, waveform blunting occurs due to a dielectric loss or a skin effect at a high frequency of a data bus wire 15. An example of a blunt waveform is illustrated in FIG. 4. Let's assume that binary data like a data signal 320 is outputted from an LSI on the transmission side through a driver 14 in FIG. 4. A waveform 321 is a waveform which has reached an input terminal of a receiver 16. This results in the input waveform of the receiver 16. The receiver 16 receives the waveform 321 therein and returns it to a rectangular pulse. This waveform is designated at numeral 322. Here, the waveform 322 greatly changes in waveform width with respect to the transmitted pulse 320. This results from the following reasons.

Now, a rectangular wave is driven from L to H and H to L, and such a waveform 321 that data has reached the receiver 16, indicates blunting due to the previous effect. When a rising pulse is transmitted from L to H, for example, blunting occurs in the waveform 321 transmitted through a wire, so that the signal is not capable of perfectly rising to an H voltage during one cycle or it cannot be perfectly charged in another expression. Therefore, the signal remains at a perfectly non-charged voltage even if the time at which the next cycle starts is reached.

Upon the high-speed data transfer, the next data is transmitted before its charge is completed. Therefore, the input waveform 321 of the receiver 16 varies according to data in the previous cycle in terms of the voltage waveform of the data. This is called "data/pattern dependency or Inter Symbol Interference (ISI)", which is one problem about speeding-up.

This shows that a setup time corresponding to a time width necessary to determine data and a hold time become short for the LSI on the receiving side. When the threshold voltage for reception is defined as $V_{REF0}$, the times at which the waveform crosses it, vary according to data patterns at T1, T2, T3 and T4 . . . . This variation is called "jitter". When the jitter increases, the time width (data window) necessary to determine the data cannot be ensured so that the rate of failure of data transfer increases. That is, it is not possible to perform higher-speed data transfer due to the waveform blunting.

In order to avoid it, there have been proposed such prior arts as shown in Dana Hall, et al., "Method for Transmitting Data over a Data Bus with Minimized Digital Inter-Symbol Interference", U.S. Pat. No. 6,577,687 B2 June, 2003 and Sanjay Dabral. et. al, "Data-Pattern Induced Skew Reducer", U.S. Pat. No. 5,953,521, September, 1999.

When the binary signal is transmitted through such a bus-connected data wire as shown in FIG. 3, actual data is transmitted in wait for a while (in wait for a sufficient reduction in voltage) without sending the actual data from a first cycle, thereby avoiding an error due to jitter. Since the reverse symbol of data was transmitted where one bit string has continued, the jitter could be reduced.

As described in U.S. Pat. No. 5,953,521, jitter reduced by data patterns was reduced by controlling driver's timing. That is, data lying in the present cycle and data lying in the immediately preceding cycle were compared. When they were found to be different from each other, a high frequency delay circuit (HF) was added with the data lying in the present cycle, whereas when they were found to be the same, a low frequency delay circuit (LF) was added with the data, thereby expanding a data window. Thus, although the jitter on the driver side can be reduced, the jitter on the receiver side cannot be reduced. This specification does not show such a disclosure as to determine a delay time or amount of the high frequency delay circuit and a delay time or amount of the low frequency delay circuit.

When such a technique as disclosed in U.S. Pat. No. 5,953,521 is used, dependency on a data pattern between continuous 2 bits can be controlled or adjusted. However, it was not possible to control a delay time or amount of dependency on data patterns of 3 bits or more.

If the state of the transmission line between LSIs is known in advance, then the delay time of the high frequency delay circuit and the delay time of the low frequency delay circuit can be determined at the stage of design of LSIs. However, when the LSI is used in a plurality of devices, the delay times cannot be determined uniquely. This is because the delay time necessary for jitter control varies for each device according to the condition of packaging of the transmission line.

A problem that the invention is to solve is to reduce jitter dependent on data patterns by an interface receiver. Another problem to be solved by the invention is to provide an LSI capable of automatically controlling the setting of a delay time for jitter reduction so as to be able to control its setting for each device.

SUMMARY OF THE INVENTION

Since the jitter dependent on the data patterns can be expected according to how the previous state is being placed, the state of data received by the receiver is held, and the timing provided to fetch input data is adjusted according to the held state and the input data.

As a control mechanism lying in the receiver, for determining a delay time dependent on the form of packaging, a driver transmits and receives pulse data set at one-cycle intervals and pulse data set at two-cycle intervals as test patterns. The receiver has an automatic control mechanism for determining a delay time optimal to a system from the difference between a rising time of each of pulses different in pulse width and its falling time.

Since the receiver is configured like the previous means, the jitter dependent on the data patterns having reached the receiver can be reduced. Thus, the speeding up of data is further enabled. Since the delay time for jitter reduction can be set by the automatic delay control circuit mechanism, the delay time can automatically be adjusted even in the case of transmission lines different in cable length or the like every devices. Therefore, it is possible to provide an LSI having a general-purpose interface free of device dependency.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 is a wiring diagram of an automatic delay controller showing a third embodiment;

FIG. 10-a is a diagram showing a flow of the automatic delay controller;

FIG. 10-b is a diagram for describing pulses for the automatic delay controller;

FIG. 23 is a diagram illustrating a 2-cycle type data signal waveform and a comparator output signal.

PREFERRED DESCRIPTION OF THE EMBODIMENTS

Figure 1:
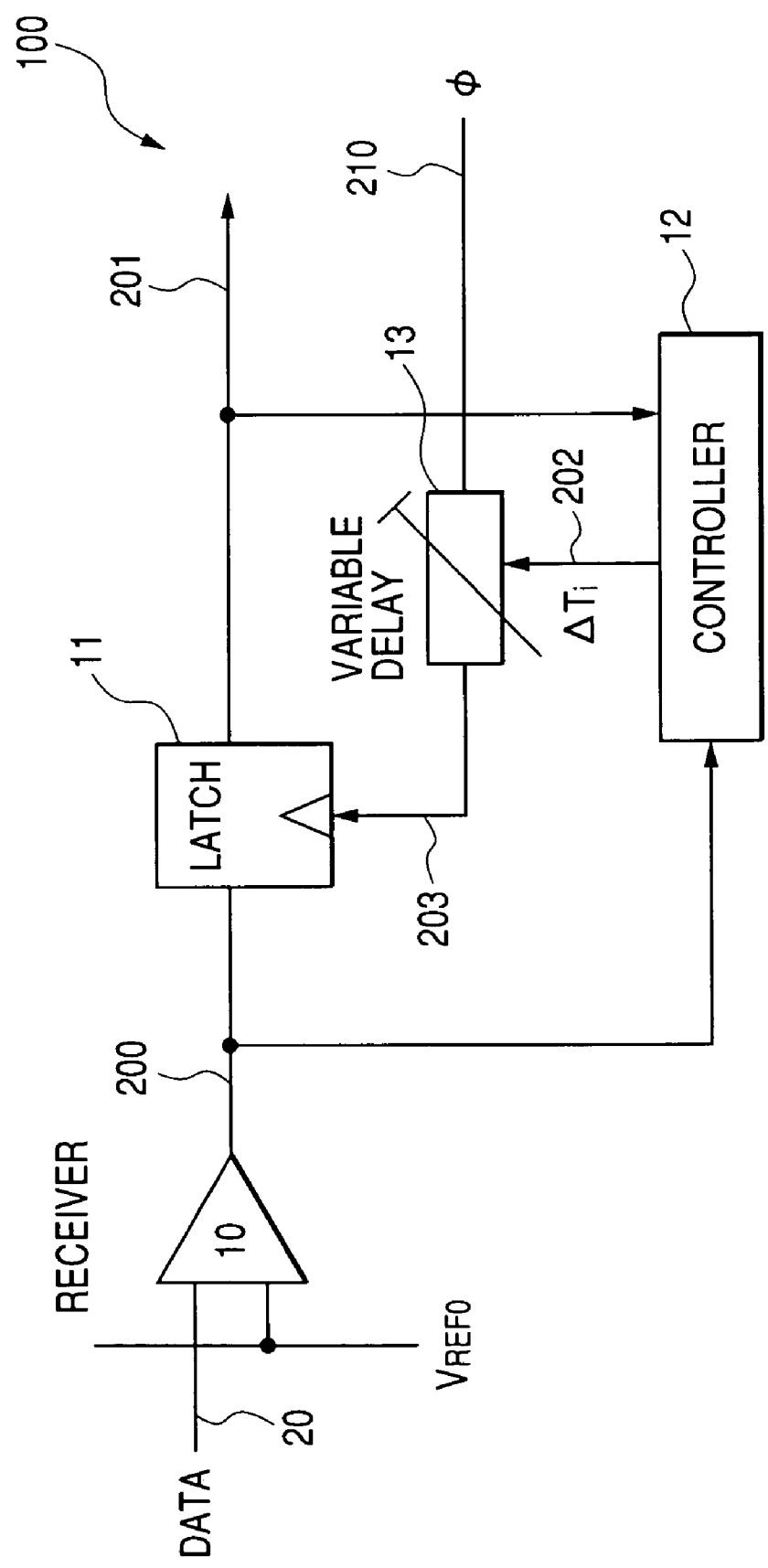
FIG. 1 is a diagram showing a deskew receiver having a jitter control circuit function, for describing a first embodiment.

Preferred embodiments of the present invention will hereinafter be described with reference to the accompanying drawings.

First Preferred Embodiment

A first embodiment will be explained using FIG. 1.

Reference numeral 100 indicates a deskew receiver having a jitter control circuit function, according to the present invention. The deskew receiver 100 receives a data signal 20 connected to a transmission line and a clock signal ($\phi$) 210 as inputs. The data signal 20 is synchronized with the clock signal 210 and outputted as an output signal 201.

The deskew receiver 100 comprises a differential comparator 10, a latch 11, a delay controller 12 and a variable delay 13.

The data signal 20 is compared with a reference voltage (VREF0) inputted to the differential comparator 10. Each of "0" and "1" is outputted as a receiver output signal 200 according to the magnitude thereof. The receiver output signal 200 is inputted to the latch 11 and the delay controller 12. The latch 11 calculates a delay amount or time in accordance with a signal outputted from the delay controller 12 and is inputted with a clock signal 203 delayed by the variable delay 13.

The clock signal 203 is produced by adding a delay time to the clock signal ($\phi$) 210 by the variable delay 13 and subtracting it therefrom thereby. The variable delay 13 adjusts or controls a delay time in accordance with a signal 202 outputted from the delay controller 12. The delay controller 12 inputs the receiver output signal 200 and the synchronized output signal 201 therein and outputs the delay control signal 202.

Figure 2:
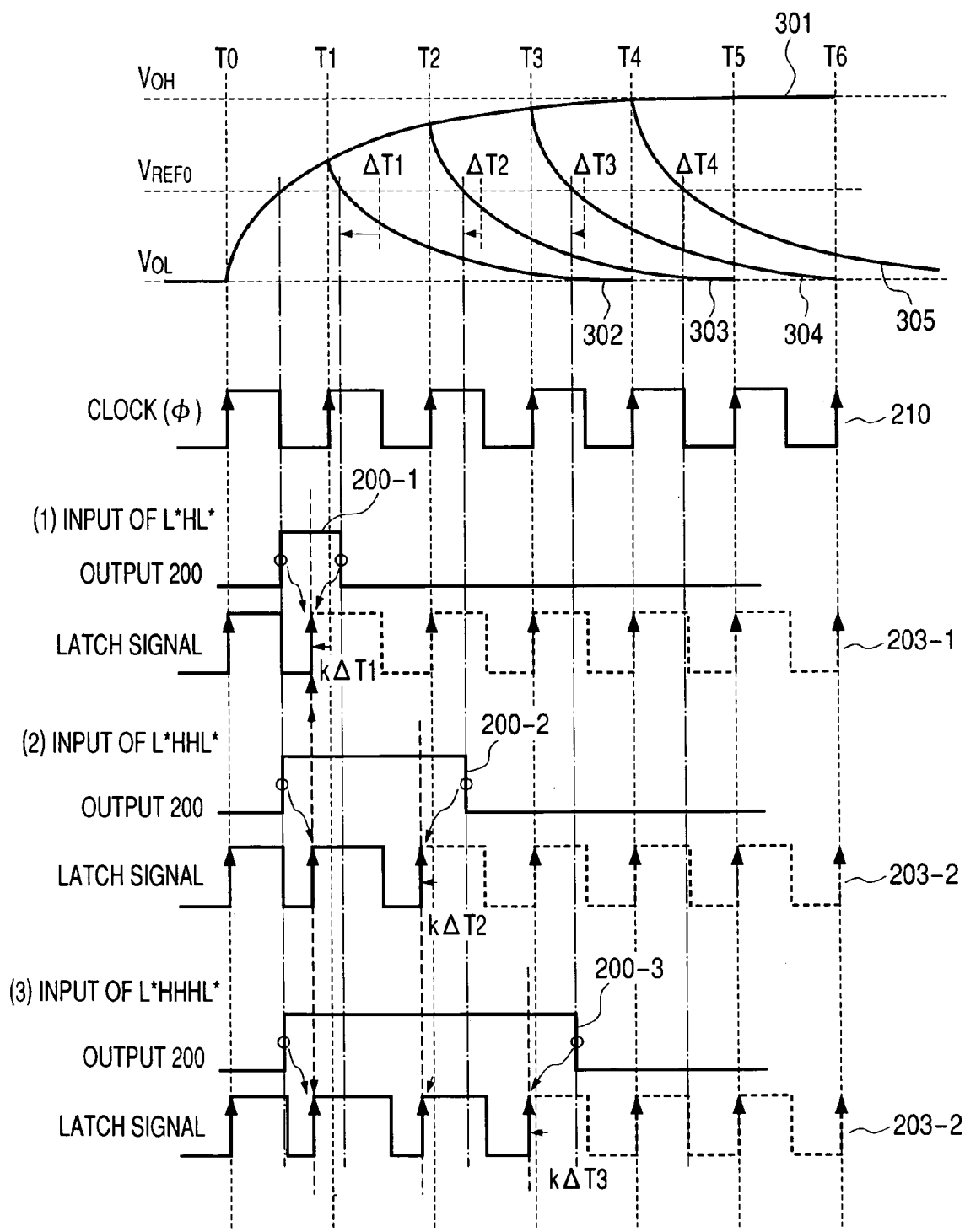
FIG. 2 is a diagram illustrating an input waveform at the input of LHL of the receiver shown in FIG. 1.
Figure 3:
FIG. 3 is a conventional interface circuit diagram.
Figure 4:
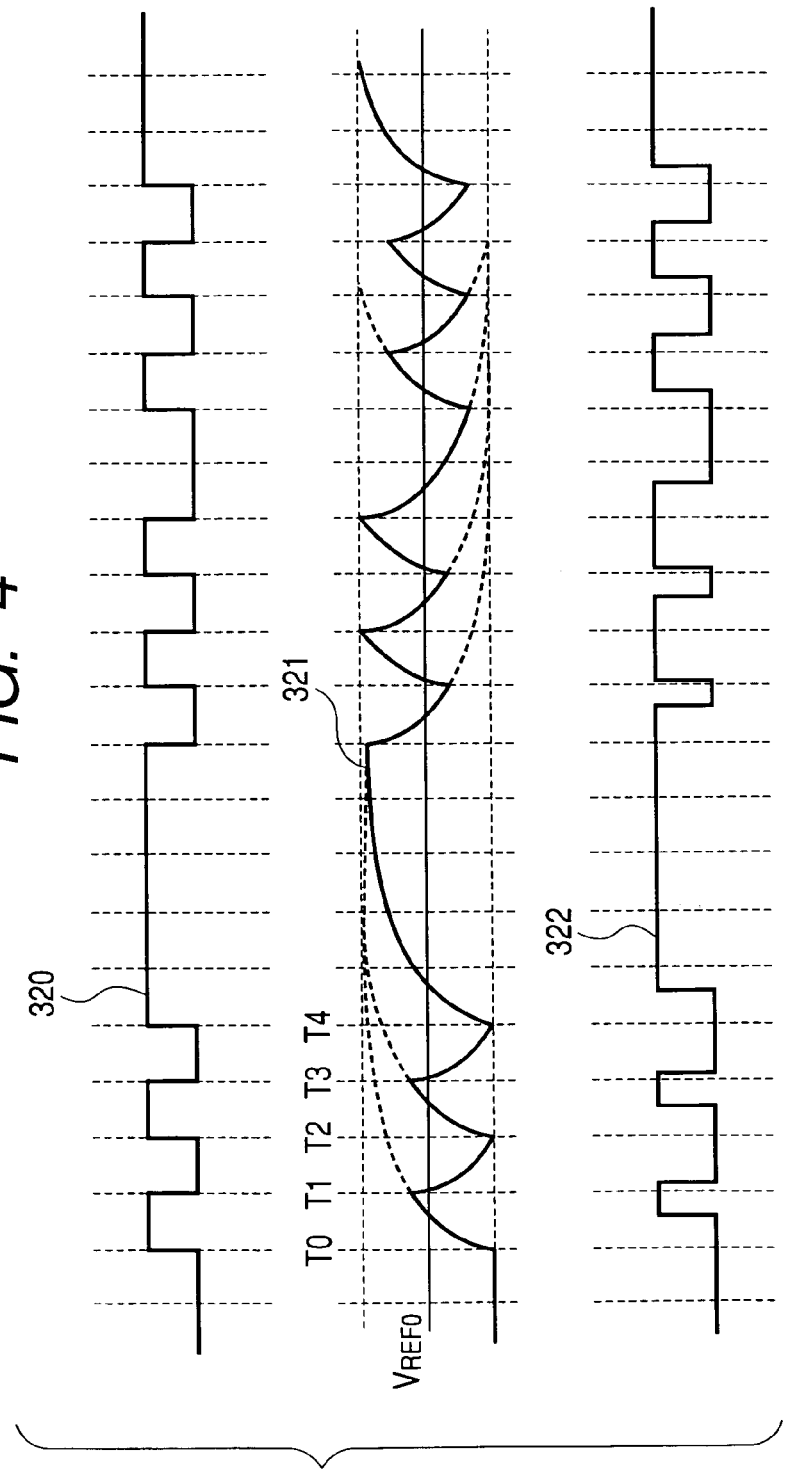
FIG. 4 is a diagram showing waveforms for describing dependency of data patterns.

Control corresponding to such a delay $\Delta$Ti as shown in FIG. 2 is performed by a combination of the delay controller 12 and the variable delay 13.

FIG. 2 shows an input wave of the signal 20 indicative of various data, the clock signal 210, the latch signal 203, etc. The horizontal axis indicates the time and the vertical axis indicates the voltage. The input waveform of the data signal 20 is plotted by superimposing five waveforms 301 through 305 on one another.

The waveform 301 indicates a waveform having L at which an input data pattern prior to a time T0 continues, and H continuous till a time T6. Now, the times T0 through T5 indicated by dotted lines indicate cycles of the data inputted to the deskew receiver 100 having the jitter control circuit function. Incidentally, when a data pattern continuous in an intended range is represented as L*, the data pattern ( . . . LLLLHHH . . . ) of the waveform 301 can be described as (L*H*).

The waveform 302 is represented as L before the time T0, H during one cycle and then L at the time T2 and subsequently. This data pattern can be represented as (L*HL*).

Similarly, the waveform 303 is represented as (L*HHL*) at which H continues during two cycles, the waveform 304 is represented as (L*HHHL*) at which H continues during three cycles in succession, and the waveform 305 is a waveform corresponding to a data pattern represented as (L*HHHHL*) at which H continues during four cycles, respectively. Since sections identical in data pattern to one another, of the waveforms 301 through 305 draw the same traces in FIG. 2, they are represented so as to overlap one another.

The waveform 301 is placed in an H state at the time T0 and subsequently and draws approximately a charge curve due to blunting or desensitization of the transmission line. Of course, reflection and crosstalk caused by impedance mismatching on the transmission line also overlap. In the case of a well-designed transmission line, however, these reflection/crosstalk noise are small but waveform blunting due to a dielectric loss and a skin effect at a high frequency is large. Thus, the waveform at a receiving terminal grows dull or blunt as designated at 301.

When the data changes before it perfectly rises or before its charge, a waveform trace in the next cycle greatly changes. Since L starts from the position on the way to the charge of the waveform 301, the waveform 302 shown in FIG. 2 becomes earlier than the waveform 301 in time at which it comes across the reference voltage VREF0. Assuming that the time at which the waveform 301 comes across the reference voltage VREF0 is taken as the reference, it is understood that the respective waveforms 302 through 305 respectively have time differences among time intervals at which they cross the VREF0. The time differences are respectively represented as $\Delta T1$ through $\Delta T4$ (or $\Delta Ti$) with respect to the waveforms 302 through 305.

Reference numeral 210 in FIG. 2 indicates the clock signal 210 in FIG. 1, and reference numerals 200-1 through 200-3 respectively indicate output waveforms of the differential comparator 10. The input data correspond to (1) L*HL* (2) L*HH*L and (3) L*HHHL* respectively. Here, the delay time of the differential comparator 10 has been described as being negligible. Reference numerals 203-1 through 203-3 respectively indicate clock signals having delay times conforming to the input data patterns, which are delayed by the variable delay 13 and the delay controller 12 on the basis of the clock signal 210. The latch 11 latches the corresponding data therein in accordance with the signals 203-1 through 203-3.

The delay controller 12 and the variable delay 13 shown in FIG. 1 are operated so as to adjust the time differences of $\Delta T1$ through $\Delta T4$ with respect to the waveforms 302 through 305 in FIG. 2 and thereby generate the delayed clock signals 203-1 through 203-3 or the like. Here, $\Delta T1$ through $\Delta T4$ indicate differences among timing fetching times, based on data pattern differences and correspond to time constants included in the delay controller 12 in advance.

A method of specifically generating the delayed clock signal 203 for data fetching will next be explained.

The initial clock 210 is in sync with the times T0 through T6.

When the input data 20 is processed as follows:

(1) With respect to L*H*L* input (waveform 302)

The output waveform of the differential comparator 10 with respect to the input data is designated at 200-1. The delay controller 12 functions so as to allow the variable delay 13 to make the receiver output 200-1 in a T0 cycle (between T0 and T1) earlier by k×$\Delta T1$. The latch 11 takes it therein in accordance with the clock signal 203-1 of the variable delay 13. Here, k indicates a suitable constant such as 0.5. While a solid line and a dotted line are being provided in 203-1, the solid line means a signal determined in an intended data cycle, and the dotted line means an undetermined signal. By operating the receiver in this way, a stable setup and a stable hold time can be ensured upon capturing of H data in the T0 cycle.

(2) With respect to (L*HHL*) input (waveform 303)

The output waveform of the differential comparator 10 with respect to the input data is designated at 200-2. The delay controller 12 functions so as to cause the variable delay 13 to make the waveform receiver output 200-2 in a T1 cycle (between T1 and T2) earlier by k×$\Delta T2$. The latch 11 captures it therein in accordance with the clock signal 203-2 of the variable delay 13. By operating the receiver in this way, a stable hold time can be ensured upon stably capturing of H data in the T1 cycle.

(3) With respect to (L*HHHL*) input (waveform 304)

Similarly, the delay controller 12 is operated to allow the variable delay 13 to make fetch timing of the latch 11 earlier by k×$\Delta T3$ in a T2 cycle (between T2 and T3). By operating the receiver in this way, a stable hold time can be ensured upon capturing H data in the T2 cycle.

With the receiver being operated in this way, a timing window can be expanded and data can be latched on the safe side even in the case of any data pattern from L*, with the result that its speeding up can be achieved.

Similarly, a similar effect is shown even on the falling edge like (H*LH*). Here, H* means the state of continuous H data. When a transmission LSI not described in the drawing is well designed, the output impedance of a driver of the LSI can be regarded as substantially identical between both L and H, and the rising edge and falling edge can be made identical in signal amplitude. Therefore, the delay controller 12 and the variable delay 13 can be operated in the same manner except for polarity.

If the delay controller 12 and the variable delay 13 are operated in this way, then the deskew receiver 100 having the jitter control circuit function is capable of fetching data regardless of pre-cycle data like (L*H) and (H*L), thus making it possible to reduce jitter with respect to these input data.

Figure 5:
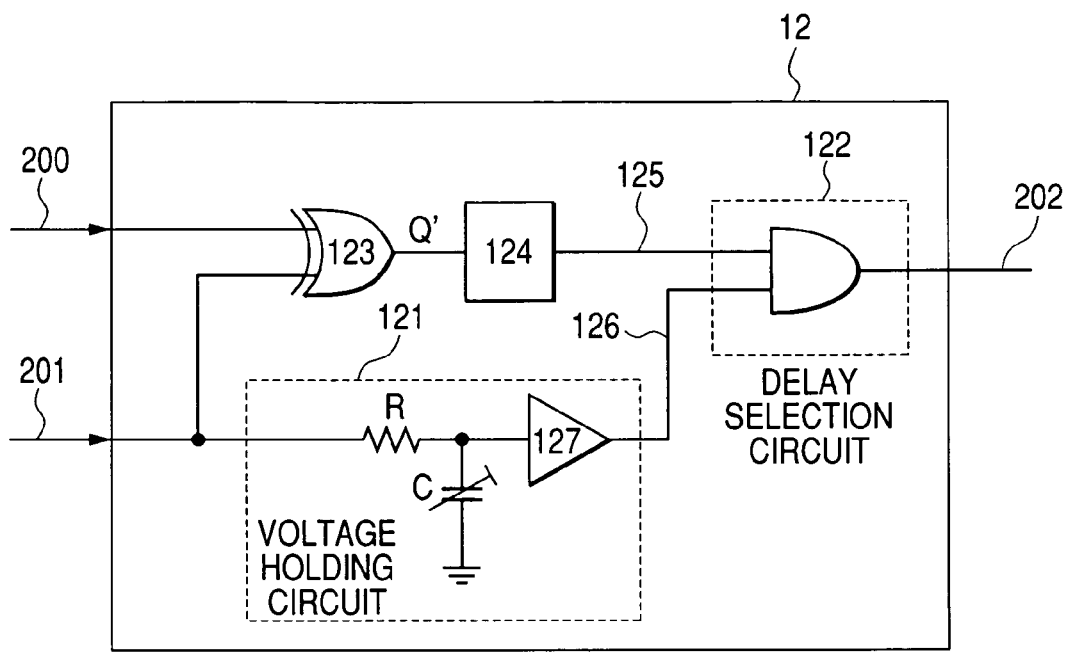
FIG. 5 is a diagram for describing a delay controller 12 employed in the first embodiment.

A configuration of the delay controller 12 which performs such an operation, is shown in FIG. 5.

The delay controller 12 is inputted with a receiver output signal 200 and a synchronized output signal 201. Then, the delay controller 12 is internally processed and thereafter outputs a delay control signal 202.

Now consider where a reduction in jitter is effected on an input signal corresponding to an nth cycle from the start of signal transfer. The state of 0 or 1 in the nth cycle will be expressed in Qn. Data $Q_{n-1}$ corresponding to a previous (n−1)th cycle is held in the synchronized output signal 201. When the data corresponding to the nth cycle is different from the data corresponding to the (n−1)th cycle, i.e., $Q_n \neq Q_{n-1}$, that is, when data switching occur on the rising edge or falling edge, an exclusive OR (XOR) circuit 123 which XORs both of the receiver output signal 200 and the synchronized output signal 201 detects this switching. A signal 125 outputted from the XOR circuit 123 is retained in a latch 124 and inputted to a delay selection circuit 122.

Further, reference numeral 121 indicates a voltage holding circuit for an (n−1)th cycle. The voltage holding circuit 121 holds eight voltage states.

Figure 6:
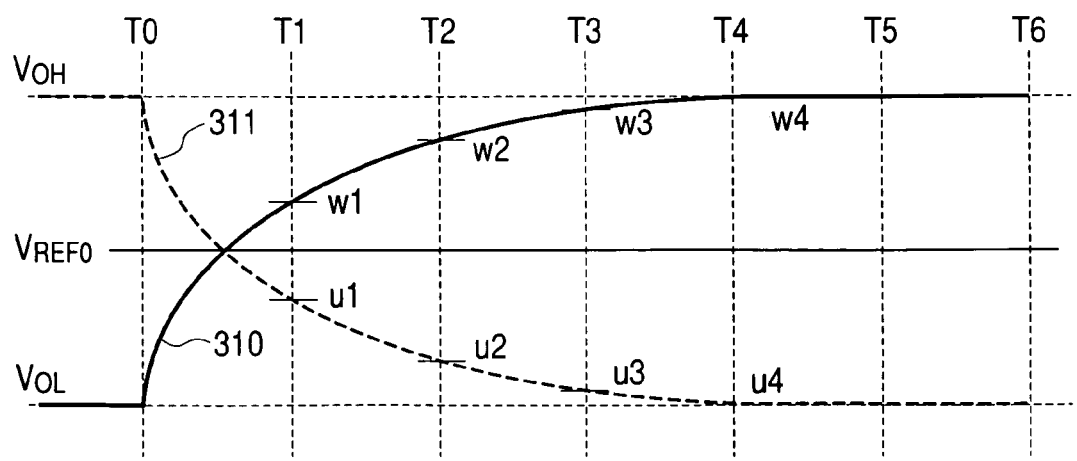
FIG. 6 is a diagram showing dispersed input voltages corresponding to an internal state of the delay controller.

Input waveforms shown in FIG. 6 are used to describe the operation thereof.

FIG. 6 shows input waveforms inputted to the receiver every data transfer cycles as in the case of times T0, T1, T2, . . . . A solid line 310 indicates a rising waveform at the time T0, and a broken line 311 indicates a falling waveform at the time T0, respectively. These waveforms are not perfectly brought to an H state even at the time T1 subsequent to one cycle. Voltages at the times T1, T2, T3 and T4 are respectively assumed to be w1, w2, w3 and w4 with respect to the rising waveform 310. Similarly, voltages thereat are respectively defined as u1, u2, u3 and u4 with respect to the falling waveform 311. This figure shows that these are charged to approximately signal amplitude after 4 cycles from data switching. However, they might be longer or shorter than it depending on the system. Although ui and wi are different in the number of states in these cases, the essential operation of the present invention is the same.

Assuming that when a transition occurs in the nth cycle, the time corresponding to the nth cycle is expressed in $T_{n-1}$, an input waveform voltage v(t) of the differential comparator 10 connected with the transmission line is expressed as follows:
a) Initial condition (state prior to transfer of data)

$$v(t)=\text{Vol or Voh } (t<0) \qquad (1)$$

where Vol indicates an L state output voltage of the driver connected to the transmission line, and Voh indicates an H state output voltage. Since the input waveform voltage v(t) is expressed by superimposing signal amplitude of w1 as viewed from Vol or signal amplitude of u1 as viewed from Voh on $v(T_{n-1})$, the input waveform voltage v(t) corresponding to the nth cycle is as follows:
b) Input voltage v(t) corresponding to the nth cycle $$v(t)=v(T_{n-1})+Q'_{n-1}u(t-T_{n-1})v0(t-T_{n-1}) \ (T_{n-1}<t\leq T_n) \qquad (2)$$

where $v(T_{n-1})$ indicates an input voltage at a start time $(T_{n-1})$ of the nth cycle, and $Q'_{n-1}$ indicates differential of data Q in the (n−1)th cycle and nth cycle. When a transition occurs, {+1 and −1} are taken, and the former means rising whereas the latter means falling. When no transition occurs, "0" is taken. Further, v0(t) indicates a voltage function of a rising pulse relative to a single pulse input L*H*. Also u(t) indicates a unit function and is defined as follows:
c)

$$u(t)=1(t\geq 0)=0(t<0) \qquad (3)$$

Although the previous wi and ui (where i=1, 2, 3 and 4) are voltages dispersed on the rising (L*H*) and falling (H*L*), they are identical in post-data switching amplitude despite of the previous states. Therefore, when the voltages subsequent to switching cycle (Tn) reach either wi or ui even if the previous data corresponds to any of wi and ui, they can be made approximate. That is, it can be said that the input voltage has eight states of wi and ui.

Figure 7:
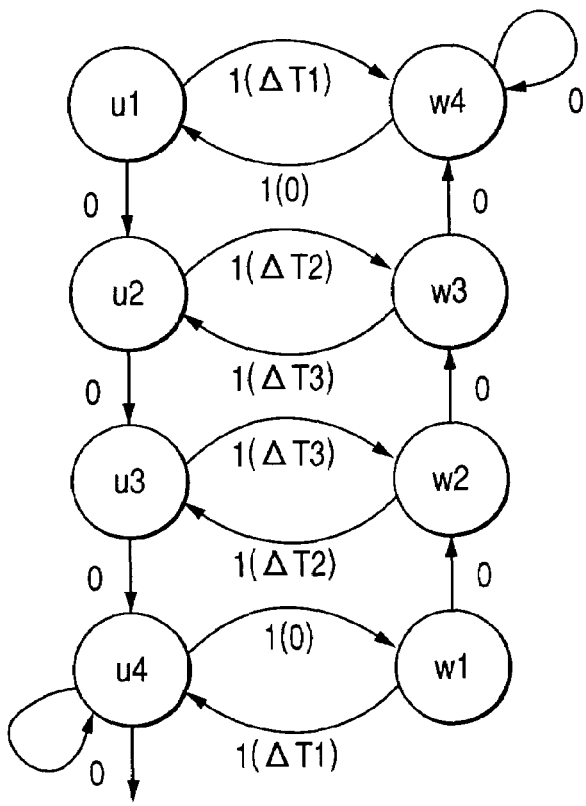
FIG. 7 is a state transition diagram in a variable delay 13.

These eight states and their transitions can be arranged as shown in FIG. 7. The present figure is a diagram showing a relationship of transition between continuous two data $Q_{n-1}$ and $Q_n$ in the delay controller 12. These are equal to transitions among eight states {wi, ui; i={1, 2, 3, 4}} shown in FIG. 6.

wi and ui surrounded by circles indicate internal states of the delay controller 12, and arrows indicate state transitions each corresponding to the value of $Q'_n$. Now, consider where $Q'_n$ represents logical differentiation of $Q_n$, and where when the transition occurs, "1" is taken, whereas when no transition occurs, "0" is taken. Although the same symbols as the expression (2) of the analog quantity are used, the same symbols are used because discussion gets untangled.

ui falls as shown in FIG. 6. In contrast, when no data switching exists ($Q'_n$=0), u2 makes a transition to u3 and u3 makes a transition to u4. These are expressed in ui→ui+1. Since the voltage remains unchanged where the next cycle is the same data ($Q'_n$=0) in the case of u4, a state transition to the same u4 is taken. Similarly, wi→wi+1 indicates a state transition ($Q'_n$=0) free of data switching with respect to the rising waveform. The state transition from w4 remains unchanged because of no change in voltage.

A description will next be made of a case in which data switching is performed from these states wi and ui ($Q'_n$=1).

Since they are identical in switching voltage width, state transitions to u1→w4, u2→w3, u3→w2 and u4→w1 are made. The inverse thereof also makes state transitions to w4→u1, w3→u2, w2→u3, w1→u4 in the same combination.

Those described in parentheses ( ) in FIG. 7 indicate delay times to be set by the variable delay 13. That is, the transition to u1→w4 needs ΔT1 for jitter reduction. However, this corresponds to the input waveform 302 of L*H*L in FIG. 2. Similarly, w1→u4 also needs the same ΔT1 because the polarity of the input waveform simply varies. Similarly, u2→w3 and w2→u3 correspond to the waveform 303 shown in FIG. 2 need ΔT2 for jitter reduction. Further, u3→w2 and w3→u2 correspond to the waveform 304 shown in FIG. 2 need ΔT3 for jitter reduction.

While FIGS. 6 and 7 has explained as described above that the behaviors of the input waveform of the receiver connected with the transmission line are considered to be the dispersed state transitions, and the transitions are provided as a finite number and regarded as the delay times necessary for jitter reduction, FIGS. 6 and 7 will be defined as functional specs of the delay controller 12 and variable delay 13 shown in FIG. 1. That is, the delay controller 12 includes thereinside the eight states shown in FIG. 7. The delay controller 12 brings their transitions to state transitions according to data switching. Further, the delay controller 12 is operated so as to determine the delay time of the variable delay 13 with respect to each of the transitions, thereby making it possible to reduce jitter.

Referring to FIG. 5, the voltage holding circuit 121 is operated so as to make each state transition as shown in FIG. 7 and hold the voltage in the (n−1)th cycle. This can be realized by, for example, configuring it as an integration circuit having a time constant (τ=RC), based on a resistor R and a variable capacitor C on an analog basis. Because this results from the following. That is, the input of the voltage holding circuit 121 corresponds to the synchronized output signal 201. This can show data pattern dependency corresponding to the same behavior as the input waveform of the differential comparator 10 because the latch 11 outputs binary data and charge/discharge is carried out with the binary data as a voltage source. Here, the time constant (τ=RC) of the voltage holding circuit 121 needs not to be identical to time constant of the input waveform shown in FIG. 6. This is because the voltage holding circuit 121 has such time constant as to be substantially saturated in the 4 cycles of FIG. 6 and may distinguish among those states. Then, a state monitoring buffer 127 detects each state stably. This can be configured of a multistage comparator. Thus, the voltage holding circuit 121 is capable of outputting the eight states.

Summarizing the delay time amounts necessary for jitter reduction every hours using FIG. 7 yields the following:

$$\Delta T1=Q'_n(u1+w1)$$

$$\Delta T2=Q'_n(u2+w2)$$

$$\Delta T3=Q'_n(u3+w3)$$

$$\Delta T4=Q'_n(u4+w4)=0 \qquad (4)$$

This computation is performed by the delay selection circuit 122. Here, $Q'_n$ is realized by the output signal 125 of the XOR circuit 123, which has been retained in the latch 124. The data lying in parentheses ( ) are realized by a signal 126 outputted from the voltage holding circuit 121. Making the product of these output signals 125 and 126 enables the generation of the delay control signal 202.

Thus, since the delay controller 12 is operated as shown in FIGS. 5 and 7, the delay controller 12 is capable of generating the delay control signal 202 indicative of a jitter-reduced amount ΔTi corresponding to the input wave. The delay control signal 202 generated by the delay controller 12 is inputted to the variable delay 13 shown in FIG. 1 from which a delay time corresponding to the value of the delay control signal 202 is generated. That is, when the delay control signal 202 is of a signal corresponding to ΔT1, the variable delay 13 makes a ΔT1 time early. Similarly, when the delay control signal 202 is of a signal corresponding to ΔT2, the variable delay 13 makes a ΔT2 time early. The following are performed in like manner.

Since it is generally not possible to make the time early, the time equal to half as much as a constant time, e.g., a data cycle is provided in advance. In contrast, the variable delay can be configured which has such an effect as to make the time early by making ΔTi early. In this case, the delay time of the variable delay 13 has a positive value in any case.

The implement of the variable delay 13 may be configured so as to vary the delay time by connecting delay elements in serial-parallel form and controlling the number of stages thereof. Alternatively, even control on a delay time interval by varying the voltage corresponding to the delay control signal 202 can perform the action similar to above.

Second Preferred Embodiment

Figure 8:
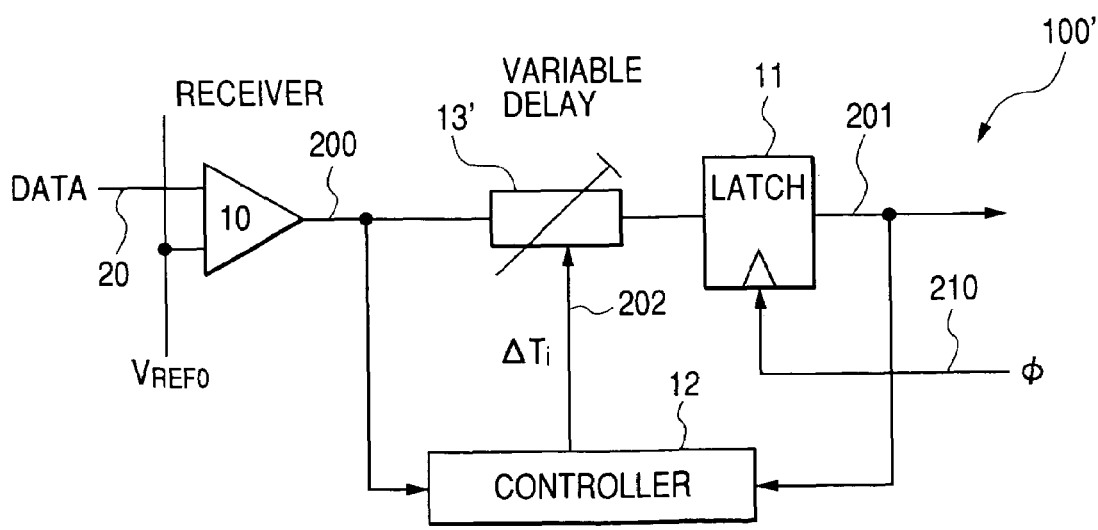
FIG. 8 is a diagram showing a deskew receiver having a jitter control circuit function, for describing a second embodiment.

A deskew receiver 100' having a jitter control circuit function, showing a second embodiment will be explained using FIG. 8.

Blocks of the same configurations/functions as those shown in FIG. 1 are given the same symbols, and the description thereof will therefore be omitted.

The difference in configuration therebetween resides in that the time to be delayed is the clock of the latch 11 in the first embodiment, whereas a data signal is delayed in the present embodiment. As to the configuration, a signal 200 outputted from a differential comparator 10 is inputted to a latch 11 through a variable delay 13', where it is synchronized. The variable delay 13' is controlled by a delay controller 12, which is operated as shown in FIG. 5 descriptive of the first embodiment. Therefore, a delay control signal 202 serves so as to transfer a delay controlled amount to the variable delay 13' in accordance with patterns of input data of the data signal 20.

The variable delay 13' generates a delay time corresponding to the delay control signal 202 received therein. The difference between the first embodiment and the present embodiment resides in that the variable delay 13' allows the signal 200 to have a delay according to the delay control signal 202 for the purpose of delaying the signal 200 in the present embodiment. For example, the delay control signal 202 generated by the delay controller 12 is inputted to the variable delay 13 of FIG. 1 from which a delay time corresponding to the value of the delay control signal 202 is generated. That is, when the delay control signal 202 is of a signal corresponding to ΔT1, the variable delay 13 delays a ΔT1 time. Similarly, when the delay control signal 202 is of a signal corresponding to ΔT2, the variable delay 13 delays a ΔT2 time. The following are processed in like manner. A delaying circuit can be realized by various methods in a manner similar to the first embodiment. This can be configured even by performing switching to the number of stages of delay elements or performing delay control by varying the voltage.

Configuring the deskew receiver 100' having the jitter control circuit function in this way makes it possible to reduce jitter related to dependency of the data of the data signal 20 as in the same effect as the first embodiment. Even if the cycle of the data dependency is 3 cycles or more, jitter can be reduced owing to their effects. Therefore, a data's timing window can be taken wide and a high-speed interface can be provided.

Further, since an internal clock (φ) can be used as a clock 210 for the latch 11, the deskew receiver can have the same timing window as the latch 11 upon data transfer of the following stage, and hence the present embodiment can be operated stabler as compared with the first embodiment.

Third Preferred Embodiment

A third embodiment will be explained using FIG. 9. The present embodiment relates to automatic control on a variable delay time that acts on the transfer of data between two LSIs. A transmission LSI 500 transmits a data signal (DQ) and a strobe signal (DQS) to a reception LSI 501. The data signal (DQ) is transmitted from a driver 14 lying in the transmission LSI 500 to a receiver 100 lying in the reception LSI 501 through a wire 15. The data strobe signal (DQS) is transmitted from a driver 14a lying in the transmission LSI 500 to a receiver 100a lying in the reception LSI 501 through a wire 15a. The data signal (DQ) corresponds to a signal end system using one wire 15 per bit, whereas the strobe signal (DQS) is defined as a differential signal using two wires 15a per bit. Therefore, the fetching or capturing of an input waveform by the receiver 100a for the DQS signal is taken at a cross point of the input waveform without using VREF0.

Next, a flow chart for jitter delay automatic control and the like are shown in FIGS. 10a and 10b.

A power-on sequence 601 is effected on the LSIs 500 and 501 and thereafter an initialization sequence 602 is operated. In the present sequence, the reset of a circuit by a reset signal, the input of a clock for DLL control, the setting of respective registers in the LSIs, etc. are carried out. This is based on specs of the respective LSIs.

Dejitter phase control is performed in Step 603.

Waveforms corresponding to the jitter phase control Step 603 are shown in FIG. 10b.

In a sequence 604, the reset of a delay time corresponding to initialization for automatic control, and the setting of a parameter i to "1" are performed. Thereafter, a handshake for the start of an automatic control sequence is performed in a sequence 605. A request for the start of the automating sequence is sent to the transmission LSI 500 through a signal line not shown in FIG. 9. After an acknowledge signal indicative of "ready" has been received on the transmission LSI 500 side, the sequence procedure proceeds to a delay control sequence 606.

In the sequence 606, the driver 14 of the transmission LSI 500 outputs a pulse (i.e., L*HL*) 350 having one cycle width to its corresponding DQ signal line as shown in the left drawing of FIG. 10b-1. At this time, the driver 14a outputs a repetitive waveform to its corresponding DQS signal line. The two DQ and DQS signals are synchronized and hence the difference in timing for switching of the DQ signal is the same in any cycle.

Although the reception LSI 501 receives the DQ signal through the input circuit 100 and receives the DQS signal through the input circuit 100a, respectively, its input waveform 351 is being blunted as shown on the upper side of the right drawing of FIG. 10b-1.

In the sequence 605, the following is done:

The differences $\Delta T_{1r}$ and $\Delta T_{1f}$ in phase between the rising and falling edges of the input DQ signal 351 with respect to the DQS signal are measured. For the sake of simplicity, the output signal of the receiver 100 is typified by the blunted input waveform 351. This measurement is done by incrementing or decrementing the number of stages of variable delay elements undescribed in FIG. 9 to thereby compare the phases of two waveforms and repeating the input of a 1 cycle pulse until the result of comparison becomes the same.

For example, the delay time of the variable delay from the rising edge of the DQ signal of the receiver 100 for the DQ signal is adjusted, and the signal thereof is compared in phase with the rising signal of the receiver 100a for the DQS signal to thereby determine a delay time difference $\Delta T_{ir}$.

Further, the delay time of the variable delay from the falling edge of the DQ signal of the receiver 100 is adjusted, and the signal thereof is compared in phase with a rising signal in another cycle of the receiver 100a for the DQS signal to thereby determine a delay time difference $\Delta T_{1f}$.

When the phase differences $\Delta T_{1r}$ and $\Delta T_{1f}$ are determined, a delay time $\Delta T_1$ to be corrected thereby can be determined by the following equation:

e)

$$\Delta T_1 = \Delta T_{1f} - \Delta T_{1r} \quad (5)$$

This is because $\Delta T_{1r}$ corresponds to the difference in delay time between the input circuit 100 for the DQ signal and the input circuit 100a for the DQS signal, with respect to (L*H), and the falling $\Delta T_{1f}$ of L*HL contains a delay time having data dependency of the transmission line 15 in terms of the difference.

Several methods are known as a method of measuring a delay time. The delay time measurement is made by being executed in the following manner, for example.

Two delay circuits identical in the minimum delay time are prepared. Then, a time difference $\Delta T_{1r}$ between a rising signal of the receiver 100a for a DQS signal and the output of the receiver 100 for a DQ signal, and a time difference $\Delta T_{1f}$ between the rising signal of the receiver 100a for the DQS signal and the output of the receiver 100 for the DQ signal are adjusted so as to be identical in delay time to each other (sequence 607).

Assuming that the numbers of stages of delay circuits for $\Delta T_{1r}$ and $\Delta T_{1f}$ are counted and they are defined as s and t, s−t is delay information about $\Delta T_1$ to be determined. This information is set to the variable delay 13 shown in FIG. 1. If the variable delay 13 corresponds to each of variable delays identical in minimum delay time, then the value thereof per se means a delay time.

Similarly, i is incremented and the sequence procedure returns to the sequence 603.

When i=2, the driver 14 of the transmission LSI 500 outputs a pulse (i.e., L*HHL*) 360 having a 2 data cycle width as shown in FIG. 10b-2. A DQS signal having a repetitive waveform is outputted from the driver 14a. The two DQ signal 360 and DQS signal are in sync with each other and the difference in timing for switching of the DQ signal is the same.

In the sequence 606, a pulse of 2 cycles is received. In the sequence 607, the reception LSI 501 measures phase differences $\Delta T_{2r}$ and $\Delta T_{2f}$ between the rising edges and falling edges of the DQ and DQS signals. Then, if the difference therebetween is determined, then it corresponds to a delay time $\Delta T_2$ to be corrected and set to the variable delay 13 in the sequence 607. This loop is repeated four times. Thus, all of $\Delta T_1$, $\Delta T_2$, $\Delta T_3$ and $\Delta T_4$ are determined and set to the variable delay 13.

Although the dejitter phase control has been effected on the rise in Step 603, the delay time can be automatically determined by using a pulse of opposite polarity in the fall. Even when the falling automatic control is not done, the value in Step 603 can also be used. This is effective for the case in which the rising edge and falling edge are symmetrical in output impedance at the driver 14.

By performing the above measurement in this way, the delay time $\Delta T_i$ in the variable delay 13 of FIG. 1 showing the first embodiment can be decided automatically. Similarly, the delay time $\Delta T_i$ in the variable delay 13' of FIG. 8 showing the second embodiment can be determined automatically.

Fourth Preferred Embodiment

Figure 11:
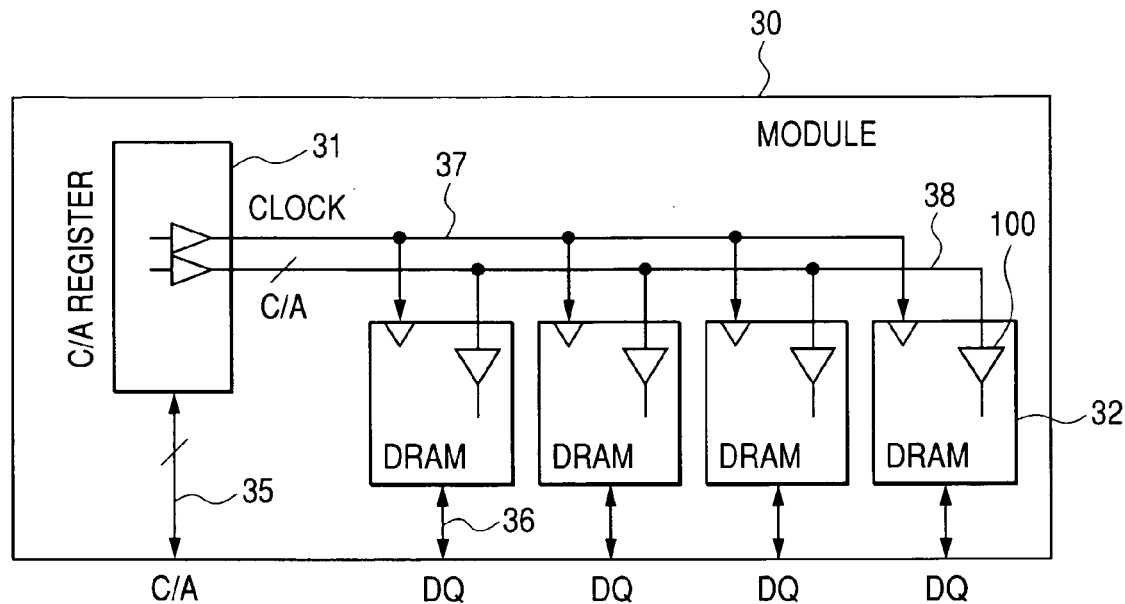
FIG. 11 is a diagram showing a fourth embodiment in which the first and second embodiments are applied to a memory module.

A fourth embodiment will be explained using FIG. 11. The present embodiment shows a case in which a jitter reduction technique is applied to a memory.

A memory module 30 is equipped with a plurality of DRAMs 32 and a register buffer 31 for control/address signal (C/A). The control/address signal (C/A) 35 is inputted to the register 31 and then transmitted to the respective DRAMs 32. The register 31 outputs a clock signal 37 and a C/A signal 38.

A data input circuit 100 is mounted in each of the DRAMs 32. Here, the input circuit 100 may be a configuration in which a jitter-reducing delay circuit is provided for the clock employed in the first embodiment. Alternatively, the input circuit 100 may be a configuration in which a jitter-reducing delay circuit is provided for the data signal employed in the second embodiment.

Also the DRAM 32 performs reading and writing of data from and to a memory controller not shown here, through the data (DQ) signal 36.

It is understood that since jitter can be reduced even by the C/A signal 38 having plural bits, such a configuration is suitable for speeding-up thereof.

Setting the receiver to a dejitter input circuit type is suitable even for speeding up of the data signals 36 in a manner similar to the C/A signal 38.

Fifth Preferred Embodiment

Figure 12:
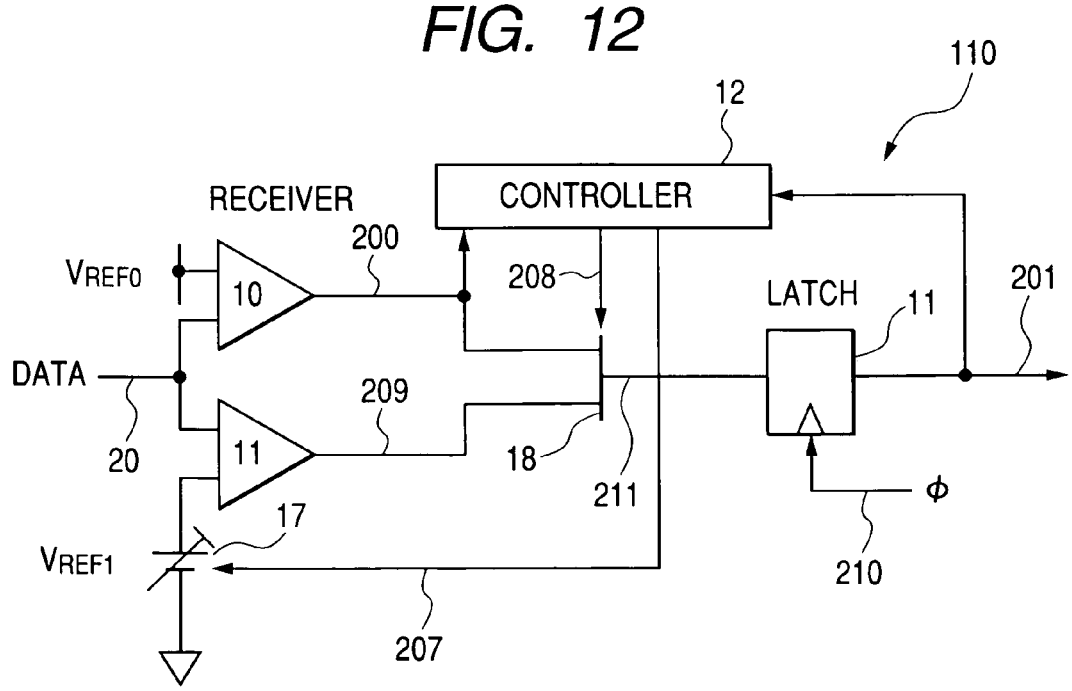
FIG. 12 is a diagram showing a deskew receiver having a jitter control circuit function, for describing a fifth embodiment.

A fifth embodiment will be explained using FIG. 12.

Reference numeral 110 indicates a deskew receiver having a jitter control circuit function, according to the present invention. The deskew receiver inputs a data signal 20 connected to a transmission line and a clock signal ($\phi$) 210 therein. The data signal 20 is synchronized with the clock signal 210 and outputted as an output signal 201.

The deskew receiver 110 comprises differential comparators 10 and 11, a variable voltage source 17, a latch 11 and a controller 12.

The data signal 20 is inputted to the differential comparators 10 and 11 and the signals inputted thereto are compared with a reference voltage (VREF0) and a reference voltage (VREF1) respectively. "0" or "1" is outputted as receiver output signals 200 and 209, respectively, according to the magnitude thereof. Here, the reference voltage (VREF1) is supplied from the variable voltage source and determined by a signal outputted from the controller 12. In a data cycle region in which the data signal 20 changes from H to L in which 4 pulses or less are continuous, a selector switch 18 serves so as to select the output signal 209. In a data cycle region in which the data signal changes from L* or H* in which 5 pulses or more are continuous, the selector switch 18 selects the output signal 200. The output signal 209 is brought to a signal 211 via the selector switch 18 and inputted to the latch 11. The output signal 200 of the differential comparator 10 is latched therein. The amount of control of the reference voltage corresponding to each of patterns of input data of the data signal 20 is determined by the controller 12.

Figure 13:
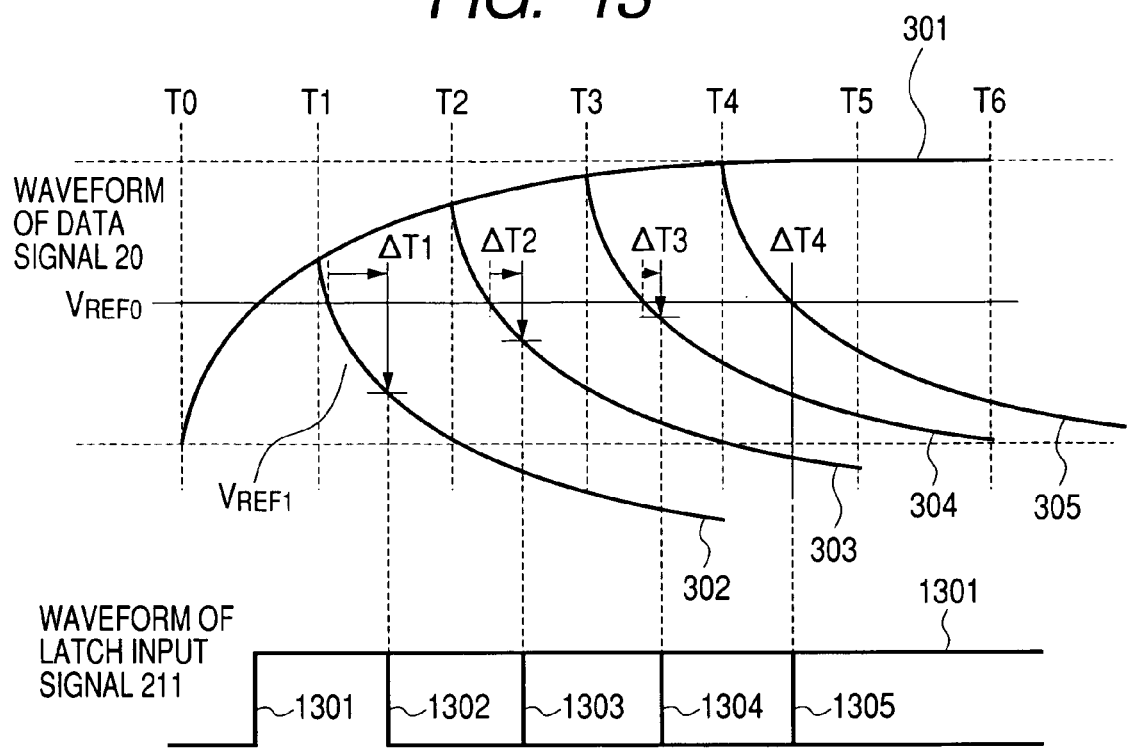
FIG. 13 is a diagram illustrating an input waveform at the input of LHL of the receiver shown in FIG. 12.

FIG. 13 shows an input waveform of the data signal 20. The horizontal axis indicates the time and the vertical axis indicates the voltage. The input signal of the data signal 20 is plotted by superimposing five waveforms 301 through 305 on one another.

The waveform 301 indicates a waveform having L at which an input data pattern prior to a time T0 continues, and thereafter H continuous till a time T6. Now, the times T0 through T5 indicated by dotted lines indicate cycles of the data inputted to the deskew receiver 110 having the jitter control circuit function. Incidentally, the description of the data pattern of the waveform 301 as (L*H*) conforms to the method shown in the first embodiment. Similarly, the data patterns of the waveform 302 and the like can be represented as (L*HL*) or the like subsequently.

In FIG. 13, the latched input signal results in H during a time interval at which the waveform of the data signal 20, which rises from L* continuous over 5 pulses, crosses the reference voltage VREF0 (1301). When the input waveform falls from the position on the way to the charge of the waveform 301, the latched input signal 211 results in L during the difference between the falling time and the time in which the waveform crosses the reference voltage VREF1 (1302). It is understood that the respective waveforms 302 through 305 respectively have time differences among times at which they cross the VREF0 and VREF1. The time differences are respectively represented as ΔT1 through ΔT4 (or ΔTi) with respect to the waveforms 302 through 305.

On the falling edge of each of the waveforms 302 through 305, signal amplitude up to the elapse of one cycle from its switching time is substantially identical to amplitude from T0 to T1 of the waveform 301.

In the present embodiment, the differential comparator 10 makes use of the reference voltage (VREF1) lower than the reference voltage (VREF0) used upon using the voltage comparison of the inputted data signal upon its rise when the data patterns fall, thereby making it possible to expand timing windows of data of the latched input signal 211 by ΔT1, ΔT2, ... ΔT4 at the falling signals of the data patterns of the waveforms 302 through 305 and provide speeding up. Using the reference voltage VREF1 higher than the reference voltage VREF0 even when the waveform 301 falls and the waveforms 302 through 305 rise to the contrary makes it possible to expand a data window of the signal inputted to the latch 11 in like manner.

Sixth Preferred Embodiment

Figure 14:
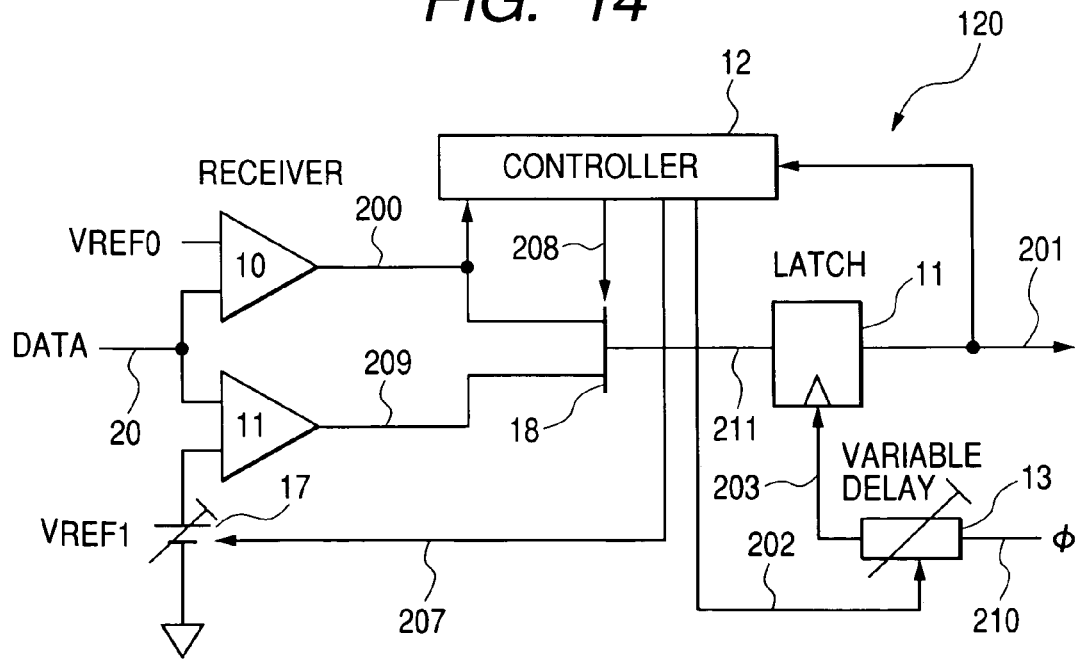
FIG. 14 is a diagram depicting a deskew receiver having a jitter control circuit function, for describing a sixth embodiment.

A sixth embodiment will be explained using FIG. 14.

Reference numeral 120 indicates a deskew receiver having a jitter control circuit function, according to the present invention. The deskew receiver inputs a data signal 20 connected to a transmission line and a clock signal (φ) 210 therein. The data signal 20 is synchronized with the clock signal 210 and outputted as an output signal 201.

The deskew receiver 120 comprises differential comparators 10 and 11, a variable voltage source 17, a latch 11, a controller 12 and a variable delay 13.

The data signal 20 is inputted to the differential comparators 10 and 11 and the signals inputted thereto are compared with a reference voltage (VREF0) and a reference voltage (VREF1) respectively. "0" or "1" is outputted as receiver output signals 200 and 209, respectively, according to the magnitude thereof. Here, the reference voltage (VREF1) is supplied from the variable voltage source and determined by a signal outputted from the controller 12. In a data cycle region in which the data signal 20 changes from H to L in which the same pulses are continuous from over 4 to under 4, a selector switch 18 serves so as to select the output signal 209. In a data cycle region in which the data signal changes from L to H in which 5 pulses or more are continuous, the selector switch 18 selects the output signal 200. Next, the latch 11 is inputted with the output signal 209 sent through the selector switch 18 and a signal 203 outputted from the variable delay 13. The output signal 200 or 209 of the differential comparator 10 or 11 is latched in the latch 11. The amount of control of the reference voltage corresponding to each of patterns of input data of the data signal 20 is supplied by controlling the reference voltage (VREF1) by means of the variable voltage source.

On the other hand, the variable delay 13 is controlled by the controller 12. A delay control signal 202 serves so as to transfer the amount of delay control to the variable delay 13 according to each of the patterns of the input data of the data signal 20.

The variable delay 13 generates the delay time corresponding to the received delay control signal 202. Further, the difference between the fifth embodiment and the sixth embodiment resides in that as in the case of the method employed in the first embodiment, a clock signal delayed by a predetermined time is inputted to the latch 11 according to the delay control signal 202, and time-base control on the amount of delay is additionally provided.

Figure 15:
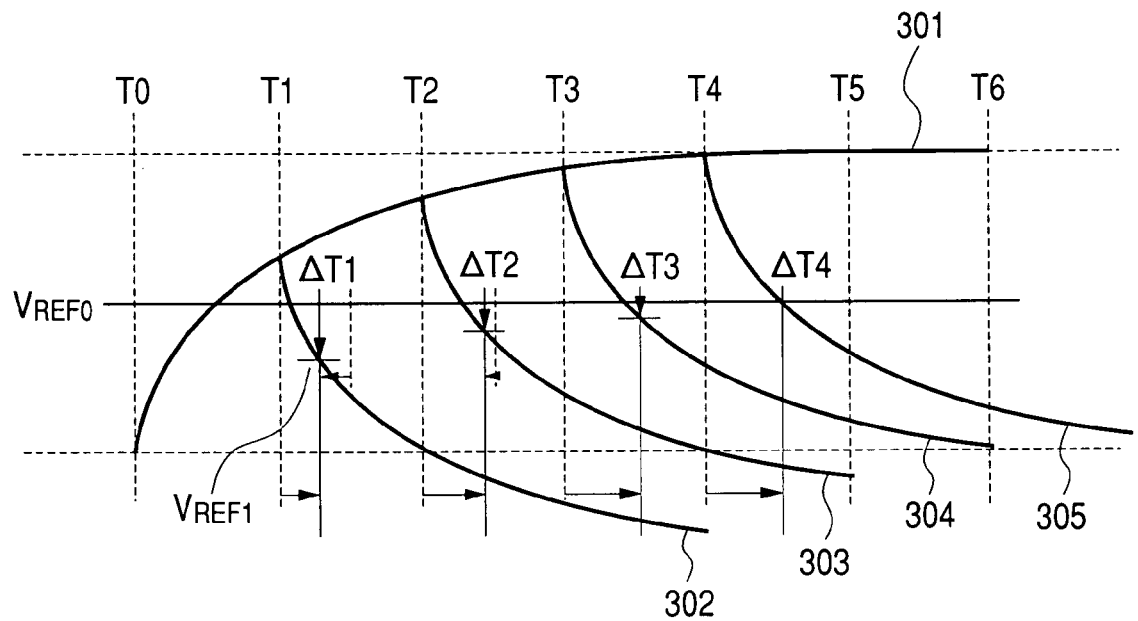
FIG. 15 is a diagram showing an input waveform at the input of LHL of the receiver shown in FIG. 14.

FIG. 15 shows an input waveform of the data signal 20. The horizontal axis indicates the time and the vertical axis indicates the voltage. The input signal or input waveform of the data signal 20 is plotted by superimposing five waveforms 301 through 305 on one another.

The description of the waveforms 301 through 305 is the same as one made in the fifth embodiment.

In FIG. 15, the time at which the rising waveform crosses the reference voltage $V_{REF0}$, is read. When the waveform falls from the position on the way to the charge of the waveform 301, the time at which the waveform crosses the reference voltage $V_{REF1}$, is read. The difference between the times is represented as ΔTi. It is understood that the respective waveforms 302 through 305 respectively have time differences among times at which they cross the $V_{REF0}$ and $V_{REF1}$ in like manner subsequently. The time differences are respectively represented as ΔT1 through ΔT4 (or ΔTi) with respect to the waveforms 302 through 305.

Further, in a manner similar to the first embodiment, the present embodiment is provided with the operation of allowing the variable delay 13 to make fetch timing of the latch 11 in a T1 cycle early by ΔT1 with respect to the waveform 302 in which the input data is of (L*HL*). The remaining waveforms 302 through 305 are also similar to the above.

Seventh Preferred Embodiment

Figure 16:
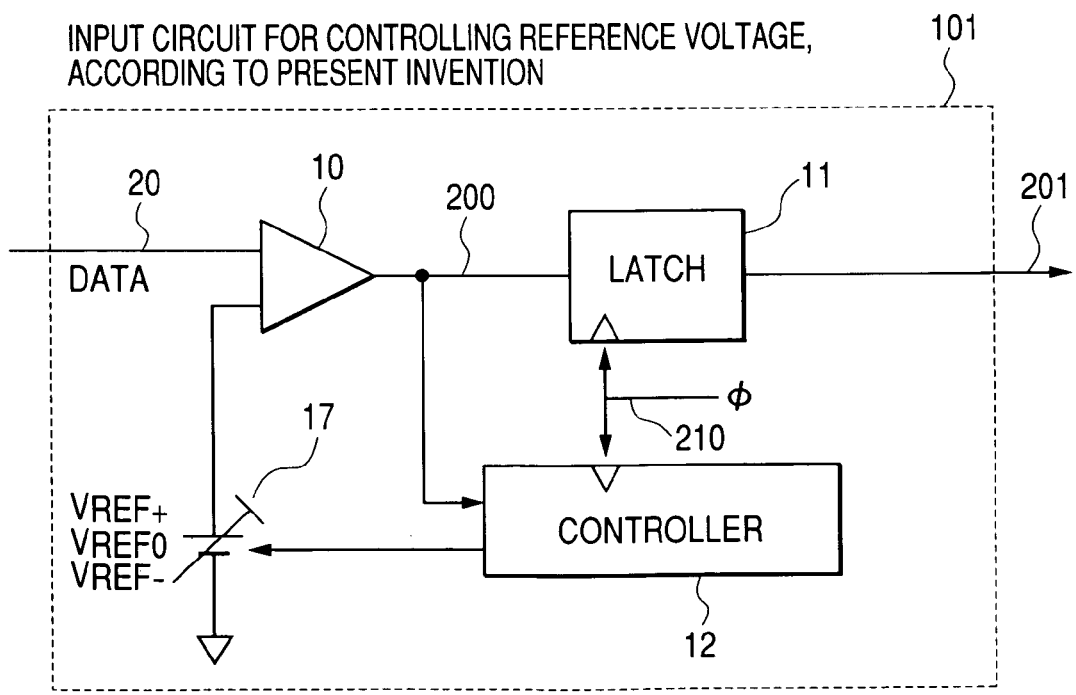
FIG. 16 is a diagram illustrating a deskew receiver for controlling a reference voltage, according to the present invention.

A seventh embodiment will be explained using FIGS. 16, 17, 18 and 19. In FIG. 16, reference numeral 101 indicates a deskew receiver having a jitter control circuit function, according to the present invention. The deskew receiver inputs a data signal 20 connected to a transmission line and a clock signal (φ) 210 therein. The data signal 20 is synchronized with the clock signal 210 and outputted as an output signal 201.

The deskew receiver 101 comprises a differential comparator 10, a variable voltage source 17, a latch 11, and a reference voltage controller 12.

The data signal 20 is inputted to the differential comparator 10 and the signal inputted thereto is compared with a reference voltage (VREF). "H" or "L" is outputted as its corresponding receiver output signal 200 according to the magnitude thereof. Here, the reference voltage (VREF) is supplied from the variable voltage source 17 and determined from three voltage values VREF+, VREF0 and VREF− in accordance with a signal outputted from the reference voltage controller 12. Here, VREF+=VDDQ×5/8, VREF0=VDDQ/2, and VREF−=VDDQ×3/8. VDDQ indicates a source voltage value and corresponds to a stable value of an H level voltage of the signal.

Figure 19:
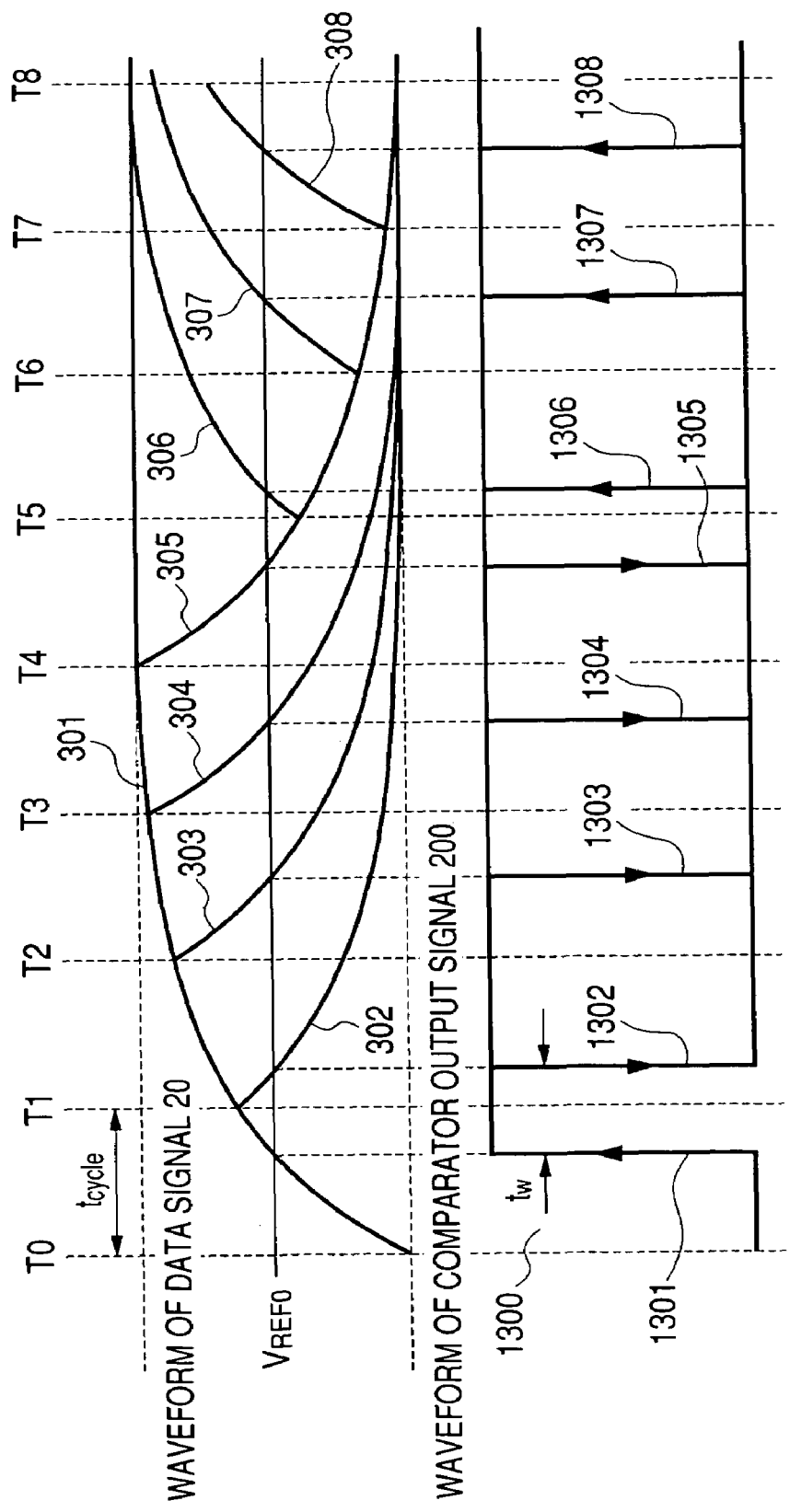
FIG. 19 is a diagram illustrating a conventional 4-cycle type data signal waveform and a comparator output signal.

Firstly, FIG. 19 shows waveforms of the data signal 20 and an output signal 200 of the differential comparator 10 where the deskew receiver is operated without controlling the reference voltage, with respect to a data signal waveform at the time that a "4 cycle type" data cycle time at which the voltage is stable by the signal where the same value of H or L is continuous 4 pulses or more, is equal to time constant τ of the data signal waveform. The horizontal axis indicates the time, and the vertical axis indicates the voltage. The data signal 20 is drawn by superimposing seven waveforms 301 through 308 on one another. The output signals of the comparator 10 corresponding to those are designated at numerals 1301 through 1308 respectively. In this case, the reference voltage is fixed to $V_{REF}=V_{REF0}$, and a data width 1300 becomes very narrow in the case of a data pattern (LHL) at T0 through T2. The H level of the data signal 20 at the time T1 has almost no allowance for the reference voltage, and the characteristic of the reference voltage resistant to noise is weak.

Figure 17:
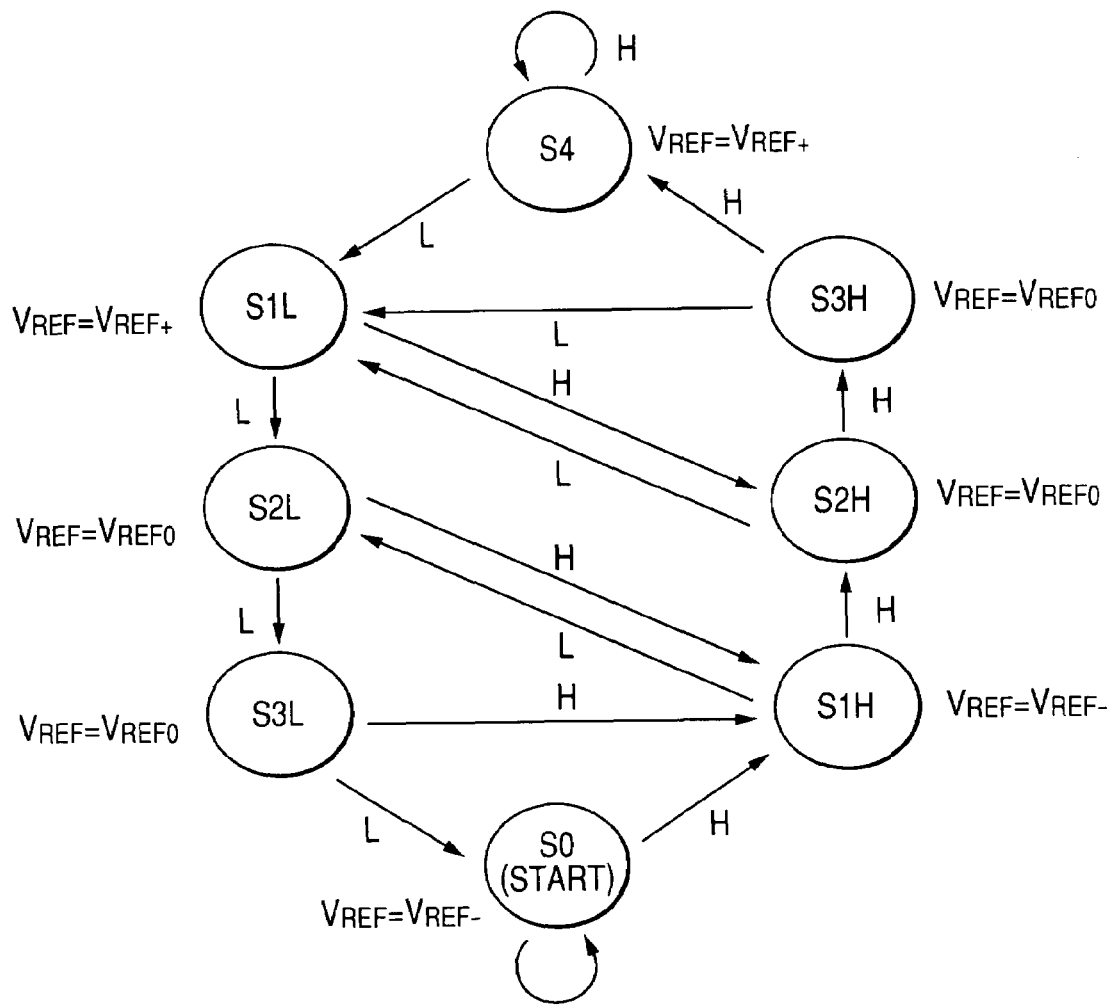
FIG. 17 is a state transition diagram with respect to a 4-cycle type data signal.

Now, FIG. 17 is a state transition diagram for determining a reference voltage according to the pattern of the output signal 201 by the reference voltage controller in the "4 cycle type" data signal waveform. A state S0 indicates a state in which L is continuous 4 pulse or more and the data signal 20 is stable. A state S4 indicates a state in which H is continuous 4 pulses or more and the data signal 20 is stable. The state S0 is first defined as an initial state. When L is inputted to the reference voltage controller here, the state is not transitioned. When H is inputted to the reference voltage controller, the state makes a transition to S1H. When L is inputted thereto in the state S1H, the state is transitioned to a state S2L, whereas when H is inputted thereto, the state is transitioned to a state S2H. When L is inputted thereto in the state S2H, the state is transitioned to a state S1L, whereas when H is inputted thereto, the state makes a transition to a state S3H. When L is inputted thereto in the state S3H, the state is transitioned to the state S1L, whereas when H is inputted thereto, the state is transitioned to the state S4. When H is inputted thereto in the state S4, no transition is made, whereas when L is inputted thereto, the state is transitioned to the state S1L. When H is inputted thereto in the state S1L, the state makes a transition to the state S2H, whereas when L is inputted thereto, the state is transitioned to a state S2L. When H is inputted thereto in the state S2L, the state is transitioned to the state S1H, whereas when L is inputted thereto, the state is transitioned to a state S3L. When H is inputted thereto in the state S3L, the state is transitioned to the state S1H, whereas when L is inputted thereto, the state is transitioned to the state S0. Then, the reference voltage controller controls the reference voltage according to the respective states as follows: $V_{REF}=V_{REF-}$ in the state S0, $V_{REF}=V_{REF-}$ in the state S1H, $V_{REF}=V_{REF0}$ in the state S2H, $V_{REF}=V_{REF0}$ in the state S3H, $V_{REF}=V_{REF+}$ in the state S4, $V_{REF}=V_{REF+}$ in the state S1L, $V_{REF}=V_{REF0}$ in the state S2L, and $V_{REF}=V_{REF0}$ in the state S3L, respectively. Incidentally, when the reference voltage in each state is set, the reference voltage is determined so as to approach the voltage at which the data signal 20 passes at the center time of the data cycle.

Figure 18:
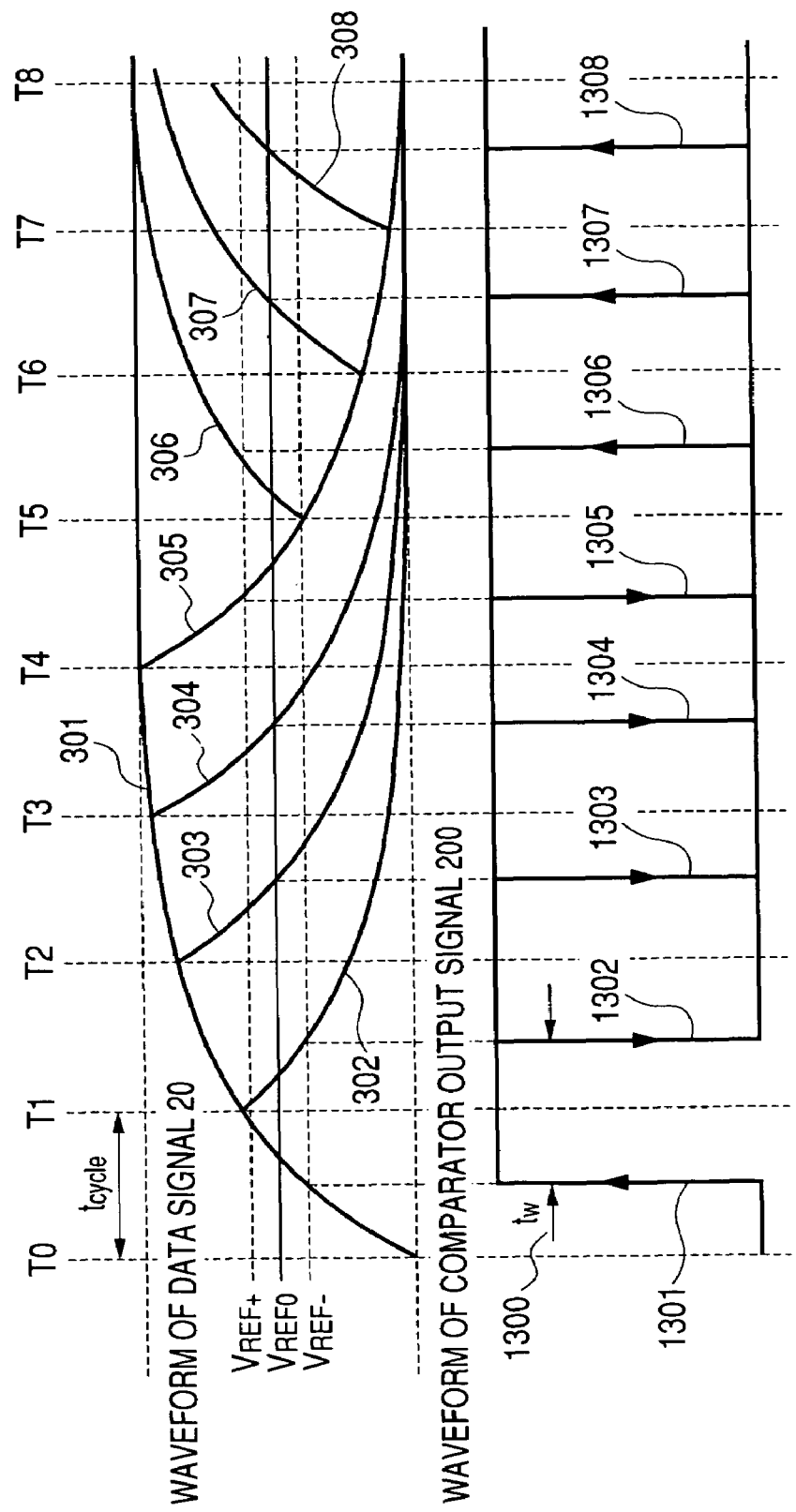
FIG. 18 is a diagram showing a 4-cycle type data signal waveform and a comparator output signal.

FIG. 18 shows waveforms of the "4 cycle type" data signal 20 and the output signal 200 of the differential comparator 10 corresponding thereto. The horizontal axis indicates the time, and the vertical axis indicates the voltage. The data signal 20 is drawn by superimposing seven waveforms 301 through 308 on one another in a manner similar to FIG. 19. The output signals of the comparator 10 corresponding to those are designated at numerals 1301 through 1308 respectively. The waveform 301 indicates a waveform having L at which an input data pattern prior to a time T0 continues, and thereafter H continuous till a time T4. Now, the times T0 through T8 indicate cycles of the data inputted to the deskew receiver 101 having the jitter control circuit function. Incidentally, the description of the data pattern of the waveform 301 as (L*H*) conforms to the method shown in the first embodiment. Similarly, the data patterns of the waveform 302 and the like can be represented as (L*HL*) or the like subsequently. The differential comparator refers to $V_{REF-}$ in the case of a data pattern (LHL) at T0 through T2. Here, $V_{REF-}$ is near a level at which the data signal 20 passes at the center time between T0 and T1 and is close to a level at which the data signal 20 passes at the center time between T1 and T2. Therefore, the time close to a data cycle is obtained as a data width 1301. Further, it is understood that if the clock signal 210 is synchronized with each of T0 through T8, then a stable data window in which a setup time and a hold time are well balanced, is obtained. The H level of the data signal 20 at the time T1 has allowance for the reference voltage $V_{REF-}$ and also has the characteristic of the reference voltage resistant to noise.

Eighth Preferred Embodiment

Figure 20:
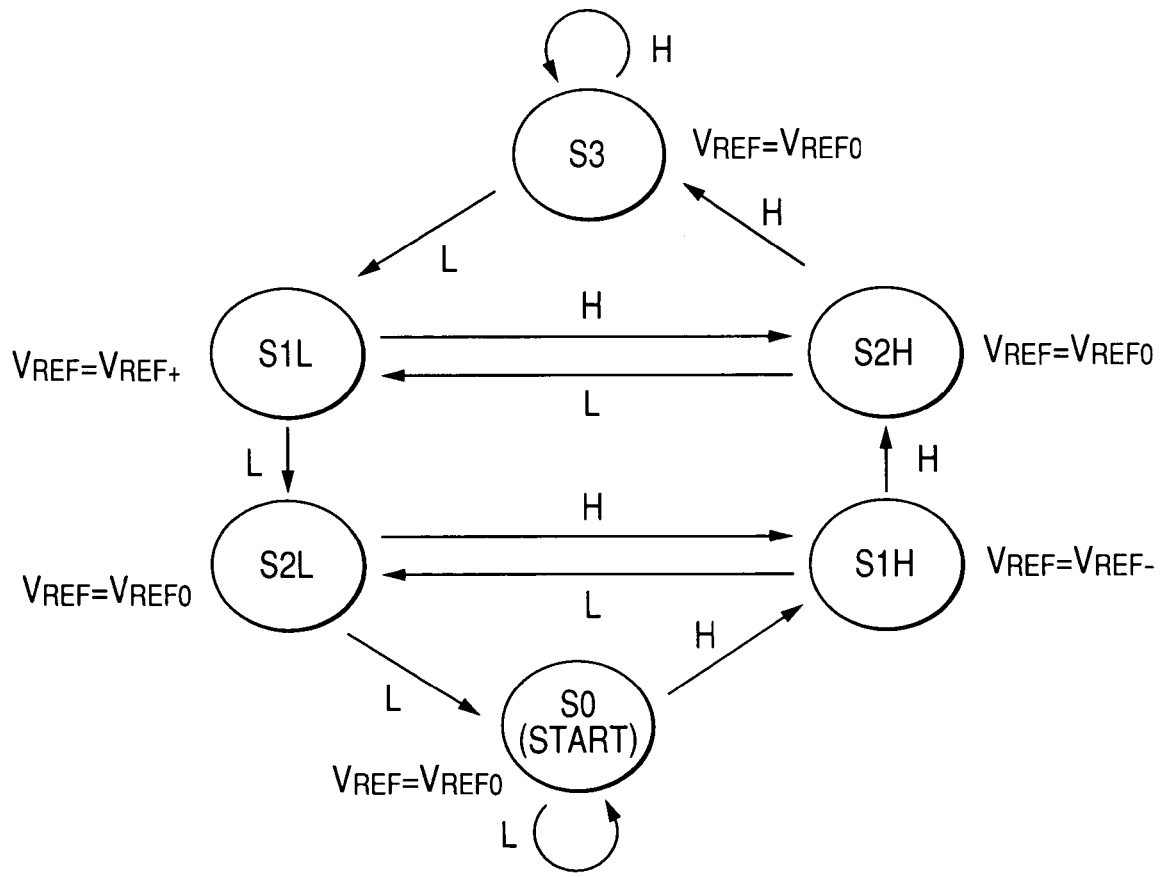
FIG. 20 is a state transition diagram with respect to a 3-cycle type data signal.
Figure 21:
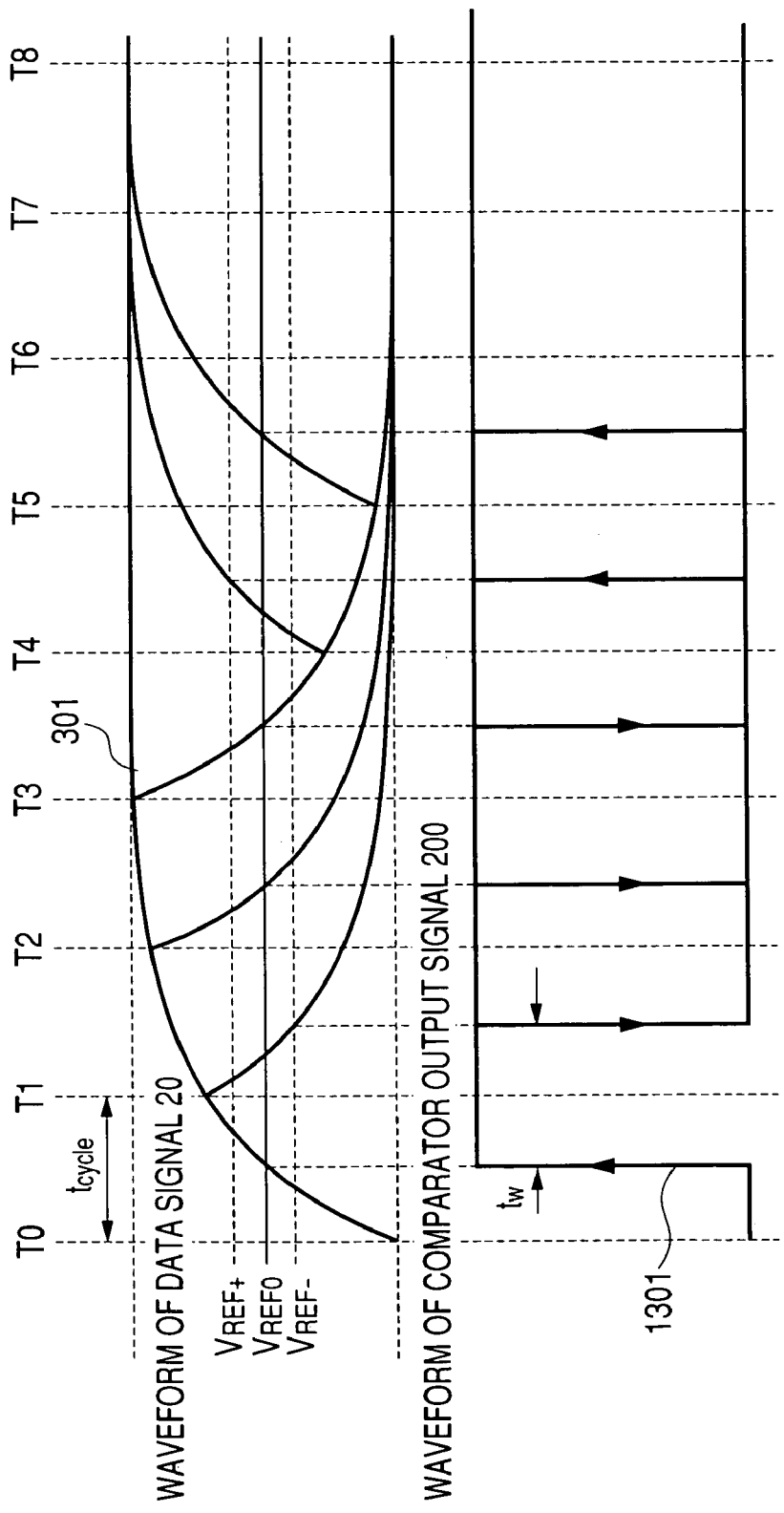
FIG. 21 is a diagram showing a 3-cycle type data signal waveform and a comparator output signal.
Figure 22:
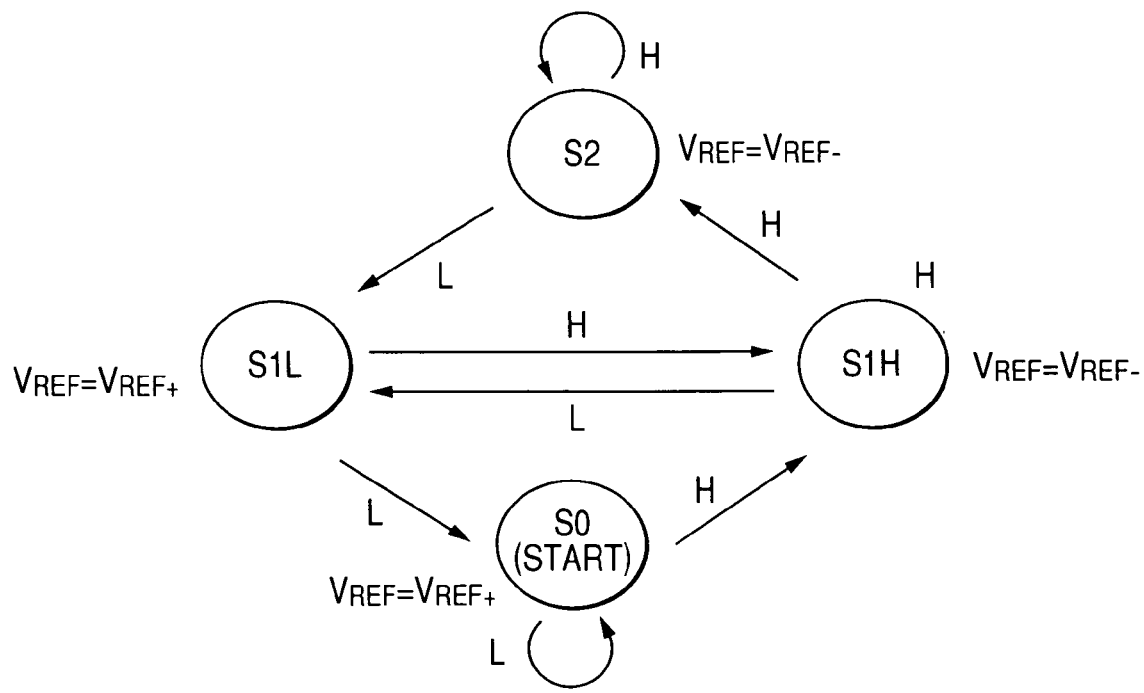
FIG. 22 is a state transition diagram with respect to a 2-cycle type data signal.

An eighth embodiment will be explained using FIGS. 20, 21, 22 and 23. FIG. 20 is a state transition diagram for determining a reference voltage according to a pattern of an output signal 201 by a reference voltage controller in the case of a "3 cycle type" data signal waveform stable in signal voltage where the same value of H or L is continuous 3 pulses or more. FIG. 21 is a diagram showing output waveforms of a data signal 20 and a differential comparator 10 where the time constant τ of the "3 cycle type" data signal waveform is equal to 75% of a data cycle time $T_{cycle}$. FIG. 22 is a state transition diagram for determining a reference voltage according to the pattern of the output signal 201 by the reference voltage controller in the case of a "2 cycle type" data signal waveform stable in signal voltage where the same value of H or L is continuous 2 pulses or more. FIG. 23 is a diagram showing output waveforms of the data signal 20 and the differential comparator 10 where the time constant τ of the "2 cycle type" data signal waveform is equal to 50% of a data cycle time $T_{cycle}$. It is understood that in either case, a stable data window in which a setup time and a hold time are well balanced, is obtained in a manner similar to the above "4 cycle type".

Controlling the reference voltage using the history of the data patters in this way makes it possible to obtain a stable data window, i.e., reduce jitter.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
a receiver circuit which receives digital data therein,
said receiver circuit including,
a first differential comparator which compares the digital data inputted thereto with a first reference voltage and thereby outputs binary data,
a second differential comparator which compares said digital data with a second reference voltage,
a variable voltage source which supplies said second reference voltage to the second differential comparator,
a selector switch which selects one of the signals outputted from the first and second differential comparators,
a latch which holds and outputs the selected signal output from the selector switch in accordance with a clock signal, and
a controller which determines said second reference voltage corresponding to a history of data patterns obtained from the output signal of the latch and the output signal of the first differential comparator,
wherein the variable voltage source is controlled by the controller and supplies said second reference voltage to the second differential comparator.

2. A semiconductor device comprising:
a receiver circuit which receives digital data therein,
said receiver circuit including,
a first differential comparator which compares the digital data inputted thereto with a first reference voltage and thereby outputs binary data,
a second differential comparator which compares said digital data with a second reference voltage,
a variable voltage source which supplies said second reference voltage to the second differential comparator,
a selector switch which selects one of the signals outputted from the first and second differential comparators,
a latch which holds and outputs the selected signal output from the selector switch in accordance with a clock signal,
a variable delay connected in a clock line supplying said clock signal to the latch, and
a controller which determines said second reference voltage and a delay time of said variable delay, corresponding to a history of data patterns obtained from the output signal of the latch and the output signal of the first differential comparator,
wherein the variable voltage source is controlled based on information about the second reference voltage sent from the controller and supplies the second reference voltage to the second differential comparator, and the latch fetches therein the selected one of the output signals of the comparators by trigger of a delayed clock signal outputted from the variable delay.

3. A semiconductor device comprising:
a receiver circuit which receives digital data therein,
said receiver circuit including,
a differential comparator which compares the digital data inputted thereto with a reference voltage used as a reference and thereby outputs binary data,
a variable voltage source which supplies said reference voltage to the differential comparator,
a latch which holds and outputs the output of the differential comparator in accordance with a clock signal, and
a reference voltage controller having internal states corresponding to a history of data patterns obtained from the latch, which controls said reference voltage according to respective states,
wherein the variable voltage source is controlled by the reference voltage controller and outputs the reference voltage to the differential comparator, whereby timing provided for the output signal of the differential comparator is adjusted according to the outputted reference voltage.

4. The semiconductor device according to claim 3, wherein each of the reference voltages in the respective states is set so as to approximate a voltage at which the received digital data hovers at the center time of a data cycle.

* * * * *